United States Patent
Nakamura

(10) Patent No.: US 8,841,975 B2
(45) Date of Patent: Sep. 23, 2014

(54) DIGITALLY CONTROLLED OSCILLATOR DEVICE AND HIGH FREQUENCY SIGNAL PROCESSING DEVICE

(71) Applicant: Renesas Mobile Corporation, Tokyo (JP)

(72) Inventor: Takahiro Nakamura, Kodaira (JP)

(73) Assignee: Renesas Mobile Corporation, Tokyo (JP)

(*) Notice: Subject to any disclaimer, the term of this patent is extended or adjusted under 35 U.S.C. 154(b) by 159 days.

(21) Appl. No.: 13/651,410

(22) Filed: Oct. 13, 2012

(65) Prior Publication Data
US 2013/0093524 A1 Apr. 18, 2013

(30) Foreign Application Priority Data
Oct. 13, 2011 (JP) ................. 2011-225806

(51) Int. Cl.
*H03B 5/12* (2006.01)
*H03L 7/099* (2006.01)
*H03C 3/09* (2006.01)
*H03L 7/02* (2006.01)

(52) U.S. Cl.
CPC .............. *H03L 7/02* (2013.01); *H03B 5/1265* (2013.01); *H03C 3/0933* (2013.01); *H03B 5/1206* (2013.01); *H03C 3/0941* (2013.01); *H03C 3/095* (2013.01); *H03L 2207/50* (2013.01); *H03L 7/099* (2013.01)
USPC ............. 331/177 V; 331/117 FE; 331/108 A; 331/36 C

(58) Field of Classification Search
USPC .............. 331/117 FE, 177 V, 36 C, 108 A
See application file for complete search history.

(56) References Cited

U.S. PATENT DOCUMENTS 7,701,304 B2 * 4/2010 Tsukizawa et al. ....... 331/117 R
2009/0066431 A1 * 3/2009 Shin et al. ............... 331/117 FE

OTHER PUBLICATIONS

Robert Bogdan Staszewski et al. "Digitally controlled oscillator (DCO)-based architecture for RF Frequency Synthesis in a Deep-Submicrometer CMOS Process", IEEE Transactions on Circuits and Systems II: Analog and Digital Signal Processing, vol. 50, No. 11, pp. 815-828, Nov. 2003.

* cited by examiner

Primary Examiner — Joseph Chang
(74) Attorney, Agent, or Firm — Miles & Stockbridge P.C.

(57) ABSTRACT

The present invention provides a digitally controlled oscillator device capable of reducing noise away from an oscillation frequency, and a high frequency signal processing device. Fractional capacitances are realized using a plurality of unitary capacitor units, for example. In one unitary capacitor unit, one ends of two types of capacitive elements are respectively coupled to oscillation output nodes. On the other hand, in the unitary capacitor units other than the one unitary capacitor unit, one ends of two types of capacitive elements are respectively coupled to a fixed voltage. The other ends of one capacitive elements in all the unitary capacitor units are coupled in common, and the other ends of other capacitive elements are also coupled in common. Turning on and off of respective switches in all the unitary capacitor units are controlled in common.

13 Claims, 21 Drawing Sheets

DIGITALLY CONTROLLED OSCILLATOR DEVICE AND HIGH FREQUENCY SIGNAL PROCESSING DEVICE

CROSS-REFERENCE TO RELATED APPLICATIONS

The disclosure of Japanese Patent Application No. 2011-225806 filed on Oct. 13, 2011 including the specification, drawings and abstract is incorporated herein by reference in its entirety.

BACKGROUND

The present invention relates to a digitally controlled oscillator device, and a high frequency signal processing device, and particularly to a technology effective when applied to a DCO (Digitally controlled oscillator) circuit for a wireless communication system, a PLL (Phase Locked Loop) circuit including the DCO circuit, and a wireless communication high frequency signal processing device including the PLL circuit.

A system for realizing fractional capacitances using a sigma delta modulator has been shown in, for example, Non-Patent Document 1.

RELATED ART DOCUMENT

[Non-Patent Document 1] Robert Bogdan Staszewski, and three more inventors, "Digitally controlled oscillator (DCO)-based architecture for RF frequency synthesis in a deep-submicrometer CMOS process", IEEE Transactions on Circuits and Systems II: Analog and Digital Signal Processing, VOL. 50, NO. 11, p. 815-828, November 2003.

SUMMARY

For example, a wireless communication system typified by a cellular phone is equipped with a high frequency signal processing device which mainly assumes frequency conversion between each baseband signal and a high frequency signal. This type of high frequency signal processing device is equipped with, for example, a PLL circuit, a mixer circuit and so on and performs frequency conversion by inputting carrier signals (local signal, local oscillation signal) for transmission/reception generated by the PLL circuit to the mixer circuit. Under such circumstances, attention has been focused on a technology which replaces an analog PLL circuit that has heretofore been widely used with a digital PLL circuit configured by a digital circuit. The digital PLL circuit is also called ADPLL (All Digital Phase Locked Loop) or the like. For example, a scale-down technology based on a CMOS (Complementary Metal Oxide Semiconductor) process can be enjoyed when the digital PLL circuit is used. It is therefore possible to achieve a reduction in area, reduction in power supply voltage, an improvement in performance (speeding-up) and the like as the technology progresses.

FIG. 20 is a block diagram showing a schematic configuration example of a digitally controlled oscillator device discussed as a premise of the present invention. The digitally controlled oscillator device DPLLc shown in FIG. 20 is equipped with a time difference detector TDC, a digital low-pass filter DLPF, a digitally controlled oscillator circuit DCOc, a multi modulus frequency divider MMD, a sigma delta modulator SDM, and a sigma delta modulator SDDCO for the digitally controlled oscillator circuit DCOc. An oscillation output signal PLLOUT outputted from the digitally controlled oscillator circuit DCOc is divided by the multi modulus frequency divider MMD. The time difference detector TDC detects a time difference (phase difference) between the divided oscillation signal FDIV and a reference oscillation signal REF. The digital low-pass filter DLPF smoothes the result of detection by the time difference detector TDC and outputs an integer capacitance value control signal W_INT based on the result of smoothing to the digitally controlled oscillator circuit DCOc. The output of the digital low-pass filter DLPF is inputted to the digitally controlled oscillator circuit DCOc as a fractional capacitance value control signal W_FRAC via the sigma delta modulator SDDCO for the digitally controlled oscillator circuit DCOc.

The sigma delta modulator SDM sets a division ratio to the multi modulus frequency divider MMD based on a division ratio set code DAT-DIVN and variably controls the division ratio on a time sequence basis to thereby set a division ratio including a fractional portion. A change in the division ratio is reflected on the integer capacitance value control signal W_INT through the time difference detector TDC and the digital low-pass filter DLPF. The digitally controlled oscillator circuit DCOc is normally configured by an LC resonant type although not shown in the drawing where it is for the wireless communication system or the like for example. The digitally controlled oscillator circuit DCOc sequentially controls the value (specifically the number of capacitors coupled to oscillation nodes) of C (capacitance) to thereby control an oscillation frequency. The number of capacitors at this time is defined by the integer capacitance value control signal W_INT, and the resolution for setting the oscillation frequency in this case is defined depending on the amount of change in one capacitance.

There is however a case where the resolution for setting a desired oscillation frequency is not obtained in the case of the amount of change in one capacitance. That is, there is a case in which a division ratio including a fractional portion, which has been set to the multi modulus frequency divider MMD by the sigma delta modulator SDM cannot be realized highly accurately. Thus, the sigma delta modulator SDDCO for the digitally controlled oscillator circuit controls the digitally controlled oscillator circuit DCOc using the fractional capacitance value control signal W_FRAC in such a manner as to be capable of realizing an amount of change in capacitance smaller than one capacitance on an equivalent basis in response to the output of the multi modulus frequency divider MMD and the output of the digital low-pass filter DLPF. Specifically, assuming that, for example, a period (called On for convenience) during which one capacitance is coupled to its corresponding oscillation node according to the integer capacitance value control signal W_INT is Ton, the one capacitance is driven to On according to the fractional capacitance value control signal W_FRAC during a period of (Ton/8), for example. As a result, each ⅛ capacitance can equivalently be realized. Incidentally, the sigma delta modulator SDDCO for the digitally controlled oscillator circuit DCOc actually variably-controls as appropriate, the timing provided to control the capacitance to be on.

Thus, it is possible to improve the resolution for setting the oscillation frequency (reduce DCO gain) where the sigma delta modulator SDDCO for the DCOc is used. As widely known, the sigma delta modulator suppresses noise characteristics near the oscillation frequency by oversampling or noise shaving. Instead, however, noise characteristics away from the oscillation frequency are degraded (noise high in offset frequency increases with the oscillation frequency as the reference). Thus, when such a digitally controlled oscillator device DPLLc as shown in FIG. 20 is applied to a transmission section of a wireless communication system of an FDD (Frequency Division Duplex) type by way example, the noise away from the oscillation frequency is in danger of affecting a reception band separated by a predetermined frequency from a transmission band.

In order to avoid this, there is, for example, considered that the sampling, frequency of the sigma delta modulator is set high. In this case, there is a fear that power consumption and an area will increase. There is also considered that the transmission section is provided with a SAW (Surface Acoustic Wave) filter to thereby suppress noise away from the oscillation frequency. Since, however, the SAW filter normally serves as a single external part, a reduction in cost at the wireless communication system and its miniaturization are in danger of becoming difficult.

One object of the present invention is therefore to provide a digitally controlled oscillator device capable of reducing noise away from an oscillation frequency, and a high frequency signal processing device. The above other objects and novel features of the present invention will become apparent from the description of the present specification and the accompanying drawings.

A summary of a typical embodiment of the inventions disclosed in the present application will be explained in brief as follows:

A digitally controlled oscillator device according to the present embodiment is equipped with first and second oscillation output nodes from which complementary oscillation output signals are output, coil elements, plurality of capacitor units and a negative resistance generating circuit. The coil elements (LP and LM) are coupled between the first oscillation output node (OscP) and the second oscillation output node (OscM). The capacitor units (CIUs) respectively have the same circuit configuration and substantially the same layout configuration. Each of the capacitor units has a first capacitive element, a first switch and a second capacitive element sequentially coupled in series between first and second nodes. The negative resistance generating circuit (AMPBK) generates a negative resistance between the first oscillation output node and the second oscillation output node. Here, a part of the capacitor units configures a first capacitor bank (CINT) as a plurality of first capacitor units. Another part of the capacitor units configure a second capacitor bank (CFRAC). The first node of each of the first capacitor units is coupled to the first oscillation output node, and the second node of each thereof is coupled to the second oscillation output node, respectively. The second capacitor bank includes capacitor blocks (CFBK) comprised of N (where N: integer greater than or equal to 2) capacitor units. Each capacitor block includes a second capacitor unit (CIU[1]) being one of the N capacitor units, and (N−1) third capacitor units (CIU[2] through CIU[k]) being other than the second capacitor unit. The first node of the second capacitor unit is coupled to the first oscillation output node, and the second node thereof is coupled to the second oscillation output node, respectively. The first and second nodes of the (N−1) third capacitor units are coupled to an AC ground power supply voltage (V6). A node (SWFD) on the first switch side, of the first capacitive element in the second capacitor unit is coupled in common to a node on the first switch side, of the first capacitive element in each of the (N−1) third capacitor units. A node (SWFS) on the first switch side, of the second capacitive element in the second capacitor unit is coupled in common to a node on the first switch side, of the second capacitive element in each of the (N−1) third capacitor units. The first switches (SWF1) in the second capacitor unit and the (N−1) third capacitor units are controlled in common in on/off operations.

Using such a configuration makes it possible to achieve each fractional capacitance without using a sigma delta modulator for a DCO and to reduce noise away from an oscillation frequency. A high-precision fractional capacitance can be achieved.

Advantageous effects obtained by a typical embodiment of the inventions disclosed in the present application will be explained in brief. A digitally controlled oscillator device capable of reducing noise away from an oscillation frequency, and a high frequency signal processing device can be realized.

BRIEF DESCRIPTION OF THE DRAWINGS

FIGS. 21A through 21C show a comparative example of the fractional-value capacitor block of FIG. 3, in which FIG. 21A is a circuit diagram illustrating a configuration example thereof, FIG. 21B is an equivalent circuit diagram taken where each switch is controlled to be on in FIG. 21A, and FIG. 21C is an equivalent circuit diagram taken where each switch is controlled to be off in FIG. 21A.

DETAILED DESCRIPTION

Figure 1:
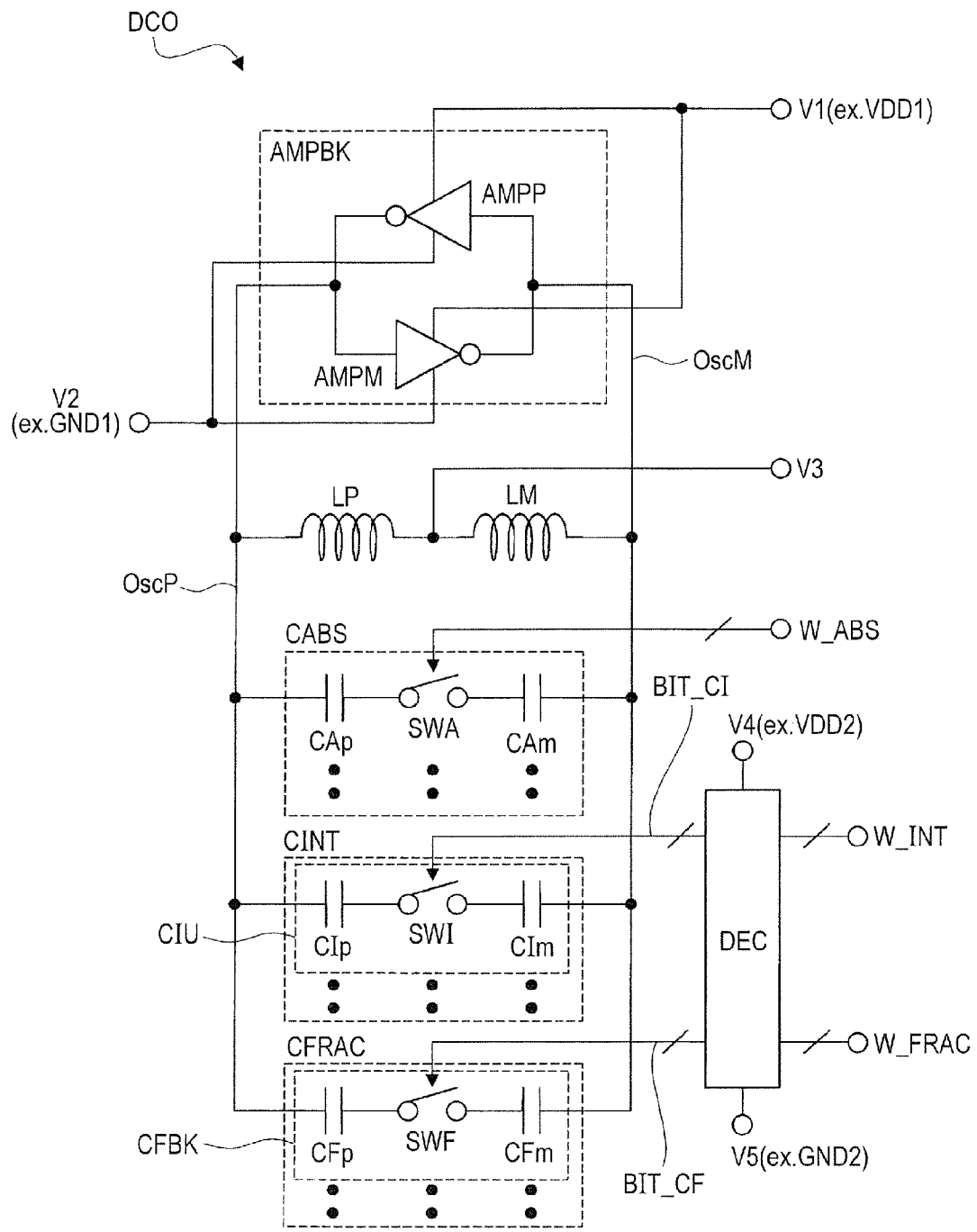
FIG. 1 is a circuit diagram showing a schematic configuration example of a digitally controlled oscillator circuit included in a digitally controlled oscillator device according to a first embodiment of the present invention.

Whenever circumstances require it for convenience in the following embodiments, the subject matter will be described by being divided into a plurality of sections or embodiments. However, unless otherwise specified in particular, they are not irrelevant to one another. One thereof has to do with modifications, details, supplementary explanations and the like of some or all of the other. When reference is made to the number of elements or the like (including the number of pieces; numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Circuit elements that configure respective functional blocks of the embodiments are not limited in particular, but formed over a semiconductor substrate like monocrystalline silicon by an IC technology of known CMOS (complementary MOS transistors) or the like. Incidentally, MOSFETs (Metal Oxide Semiconductor Field Effect Transistors) (abbreviated as MOS transistors) are used as one example of MISFETs (Metal Insulator Semiconductor Field Effect Transistors), but a non-oxide film will not be excluded as a gate insulating film.

Preferred embodiments of the present invention will hereinafter be described in detail based on the accompanying drawings. Incidentally, the same reference numerals are respectively attached to the same components or members in principle in all the drawings for describing the embodiments, and their repetitive description will be omitted.

First Embodiment

<<Schematic Circuit Configuration of Digitally Controlled Oscillator Circuit>>

FIG. 1 is a circuit diagram showing a schematic configuration example of a digitally controlled oscillator circuit included in a digitally controlled oscillator device according to a first embodiment of the present invention. The digitally controlled oscillator circuit DCO shown in FIG. 1 is equipped with an amplifier circuit block AMPBK, coil elements LP and LM, capacitor banks of three systems CABS, CINT and CFRAC, and a decoder circuit DEC. The amplifier circuit block AMPBK functions as a negative resistance circuit and has an amplifier circuit AMPM that performs an inverse operation with an oscillation output node OscP on the positive polarity side taken as an input and an oscillation output node OscM on the negative polarity side taken as an output, and an amplifier circuit AMPP that performs an inverse operation with the oscillation output node OscM taken as the input and the oscillation output node OscP taken as the output in reverse.

While the amplifier circuits AMPP and AMPM are respectively not limited in particular, they are respectively comprised of typically a CMOS inverter circuit including a PMOS transistor and an NMOS transistor. Each of the amplifier circuits AMPP and AMPM is operated by a fixed voltage (e.g., a power supply voltage VDD1) V1 on the high potential side, and a fixed voltage (e.g., a ground power supply voltage GND1) V2 on the low potential side. Incidentally, each of the amplifier circuits AMPP and AMPM can also be comprised of one NMOS transistor as the case may be (that is, the amplifier circuit block AMPBK may be comprised of two NMOS transistors (gate of one thereof is coupled to its corresponding drain of the other thereof) cross-coupled). The coil element LP has one end coupled to the oscillation output node OscP. The coil element LM has one end coupled to the oscillation output node OscM. The other ends of the coil elements LP and LM are supplied with a fixed voltage (e.g., VDD1 or GND1) V3.

The capacitor bank CABS is intended for the adjustment of a frequency band and has a capacitive element CAp whose one end is coupled to the oscillation output node OscP, a capacitive element CAm whose one end is coupled to the oscillation output node OscM, and a switch SWA coupled between the other end of the capacitive element CAp and the other end of the capacitive element CAm. Although a set of circuits comprised of the capacitive element CAp, the switch SWA and the capacitive element CAm is typically shown herein, such circuits are actually provided as plural sets between the oscillation output nodes OscP and OscM. The capacitor bank CINT is intended for the adjustment of an integer value and has a capacitive element CIp whose one end is coupled to the oscillation output node OscP, a capacitive element CIm whose one end is coupled to the oscillation output node OscM and a switch SWI coupled between the other end of the capacitive element CIp and the other end of the capacitive element CIm. Actually, such circuits are provided between the oscillation output nodes OscP and OscM as plural sets. The capacitor bank CFRAC is intended for the adjustment of a fractional value and has a capacitive element CFp whose one end is coupled to the oscillation output node OscP, a capacitive element CFm whose one end is coupled to the oscillation output node OscM, and a switch SWF coupled between the other end of the capacitive element CFp and the other end of the capacitive element CFm. Actually, such circuits are provided between the oscillation output nodes OscP and OscM as plural sets.

The switch SWA is controlled in on/off operation by an automatic band control signal W_ABS. The switches SWI and SWF are controlled in on/off operations by the decoder circuit DEC. The decoder circuit DEC is operated by a fixed voltage (e.g., a power supply voltage VDD2) V4 on the high potential side and a fixed voltage (e.g., ground power supply voltage GND2) V5 on the lower potential side. The decoder circuit DEC receives an integer capacitance value control signal W_INT and fractional capacitance value control signal W_FRAC as inputs, controls on/off of the switch SWI through an on/off control line (on/off control signal) BIT_CI according to the integer capacitance value control signal W_INT and controls on/off of the switch SWF through an on/off control line (on/off control signal) BIT_CF according to the fractional capacitance value control signal W_FRAC.

Here, one set comprised of the capacitive element CIp, the switch SWI and the capacitive element CIm lying within the capacitor bank CINT is called a unitary capacitor unit CIU. One set comprised of the capacitive element CFp, the switch SWF and the capacitive element CFm lying within the capacitor bank CFRAC is called a fractional value capacitor block CFBK. Since a plurality of sets of unitary capacitor units CIUs are provided within the capacitor bank CINT as described above, the on/off control line BIT_CI is configured in plural form correspondingly. The on/off control line BIT_CF is also configured in plural form in like manner. The decoder circuit DEC changes by "1" the number of the unitary capacitor units CIUs each controlling the switch SWI to on via the on/off control line BIT_CI each time the value of the integer capacitive value control signal W_INT is changed by "1", for example.

Such a digitally controlled oscillator circuit DCO has an LC resonance type configuration based on the coil elements LP and LM and the respective capacitive elements lying within the capacitor banks CABS, CINT and CFRAC and outputs complementary oscillation output signals to the oscillation output nodes OscP and OscM. At this time, the amplifier circuit block AMPBK functions as a negative resistance circuit that cancels out a parasitic resistive component of the corresponding LC section. The oscillation frequency of the digitally controlled oscillator circuit is controlled by turning on/off of each switch in each of the capacitor banks CABS, CINT and CFRAC. Each capacitive element included in the set in which the switch is controlled to be on principally contributes as a parameter that defines the oscillation frequency.

Here, the relationship between the effective capacitance values of the respective capacitive elements in the capacitor banks CABS, CINT and CFRAC is placed in terms of CAp (=CAm)>CIp (=CIm)≥CFp (=CFm). Thus, the oscillation frequencies are adjusted in 2 MHz units by the automatic band control signal W_ABS (CABS), 10 kHz units by the integer capacitance value control signal W_INT (CINT) and 0.625 kHz units by the fractional capacitance value control signal W-FRAC (CFRAC) respectively. Although not limited in particular, an adjustment of 512 steps (about 1 GHz range) is performed in 2 MHz units in the capacitor bank CABS. An adjustment of 2048 steps (about 20 MHz range) is performed in 10 kHz units in the capacitor bank CINT.

In such a configuration, one of the major features of the digitally controlled oscillator device according to the first embodiment resides in that the fractional value capacitor block CFBK in the capacitor bank CFRAC is configured by combining capacitor units having the same circuit configuration as the unitary capacitor unit CIU in the capacitor bank CINT and substantially the same layout configuration as that in plural form, whereby frequency resolution smaller than that of the capacitor bank CINT is realized. Providing such a CFBK makes it possible to realize prescribed frequency resolution without using a sigma delta modulator SDDCO in FIG. 20) or the like. It is therefore possible to typically reduce noise being distant from the oscillation frequency. As a result, an increase in power consumption and an increase in area due to an increase in the sampling frequency of the sigma delta modulator as described above can be suppressed, and a SAW filter or the like becomes unnecessary in a transmission section. It is therefore possible to achieve a reduction in cost in a wireless communication system, its size reduction and the like.

<<Detailed Configuration of Switch>>

Figure 2:
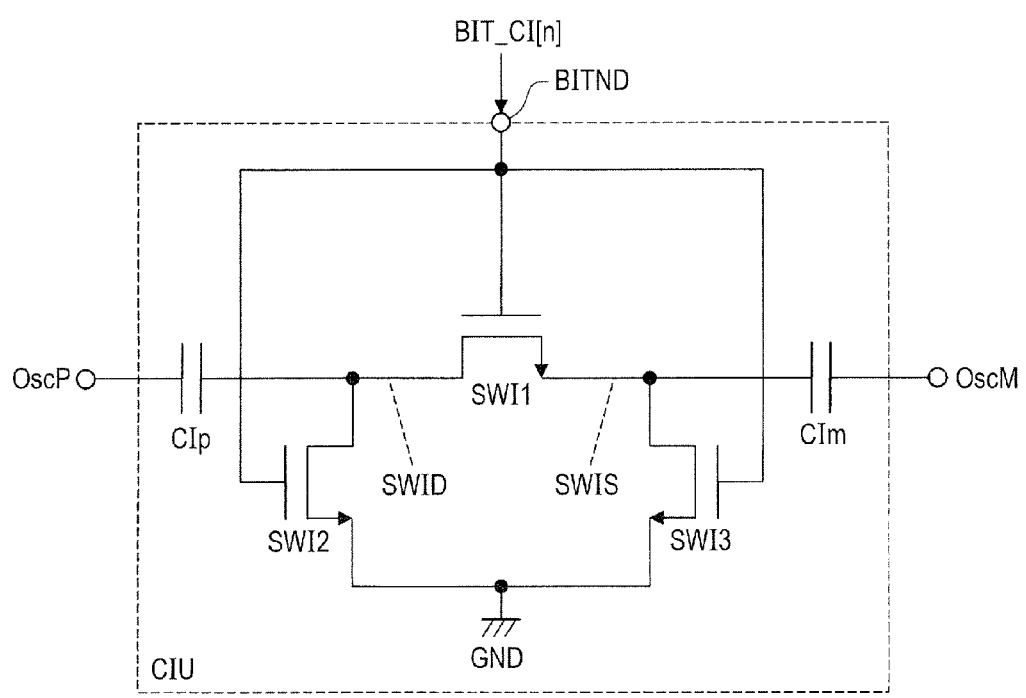
FIG. 2 is a circuit diagram illustrating a detailed configuration example of the periphery of a switch in each unitary capacitor unit in the digitally controlled oscillator circuit shown in FIG. 1.

FIG. 2 is a circuit diagram showing a detailed configuration example of the periphery of a switch in each unitary capacitor unit in the digitally controlled oscillator circuit shown in FIG. 1. A configuration example of one unitary capacitor unit CIU lying in the capacitor bank CINT shown in FIG. 1 is shown as typical. In the example of FIG. 2, the switch SWI is comprised of three switches SWI1 through SWI3 provided between the capacitive elements CIp and CIm. The switch SWI1 is comprised of an NMOS transistor whose source-to-drain path is formed between one end (node SWID) of the capacitive element CIp and one end (node SWIS) of the capacitive element CIm. The switch SWI2 is comprised of an NMOS transistor whose source-to-drain path is formed between the node SWID and the ground power supply voltage GND. The switch SWI3 is comprised of an NMOS transistor whose source-to-drain path is formed between the node SWIS and the ground power supply voltage GND. As the ground power supply voltage GND, for example, the ground power supply voltage GND2 shown in FIG. 1 is used. The gates of the NMOS transistors that respectively configure the switches SWI1 through SWI3 are coupled to an on/off control node BITND included in the unitary capacitor unit CIU. This BITND is driven by any one (BIT_CI[n] of the above-described on/off control lines BIT_CI.

When the on/off control line BIT_CI[n] is driven to an 'H' level here, the nodes SWID and SWIS are electrically coupled to each other and short-circuited to the ground power supply voltage GND. In this case, the capacitive elements CIp and CIm contribute as parameters at the time that the oscillation frequency is set at the oscillation output nodes OscP and OscM. On the other hand, when the on/off control line BIT_CI[n] is driven to an 'L' level, the nodes SWID and SWIS are electrically isolated from each other and respectively brought to a high impedance state. In this case, the capacitive element CIp and CIm ideally do not contribute as parameters at the time that the oscillation frequency is set. That is, the on/off control node BITND has the function of selecting whether the capacitive elements CIp and CIm should be allowed to contribute as the parameters at the time that the oscillation frequency is set.

Incidentally, of course, the configuration of the switch SWI is not limited to such a configuration as shown in FIG. 2, but can be modified in various ways. In FIG. 2, for example, the nodes SWID and SWIS are assumed to be virtually grounded on an AC basis in principle by driving the switch SWI1 to On. The switches SWI2 and SWI3 become therefore unnecessary. Since, however, a mismatch in differential balance and an error from the virtual ground according to the time constant of the switch SWI1 and the like actually occur, switches (switches SWI2 and SWI3 in the example of FIG. 2) that allow the nodes SWID and SWIS to be grounded on an AC basis may desirably be provided. Although the capacitive elements CIp and CIm are not limited in particular, for example, a MIM (Metal Insulator Metal) capacitor, a MOM (Metal Oxide Metal) capacitor and the like may be used in terms of a reduction in variation of the characteristics of each capacitive element, and the like.

<<Configuration (Major Feature of First Embodiment) of Capacitor Bank (for Fractional Value))

Figure 3:
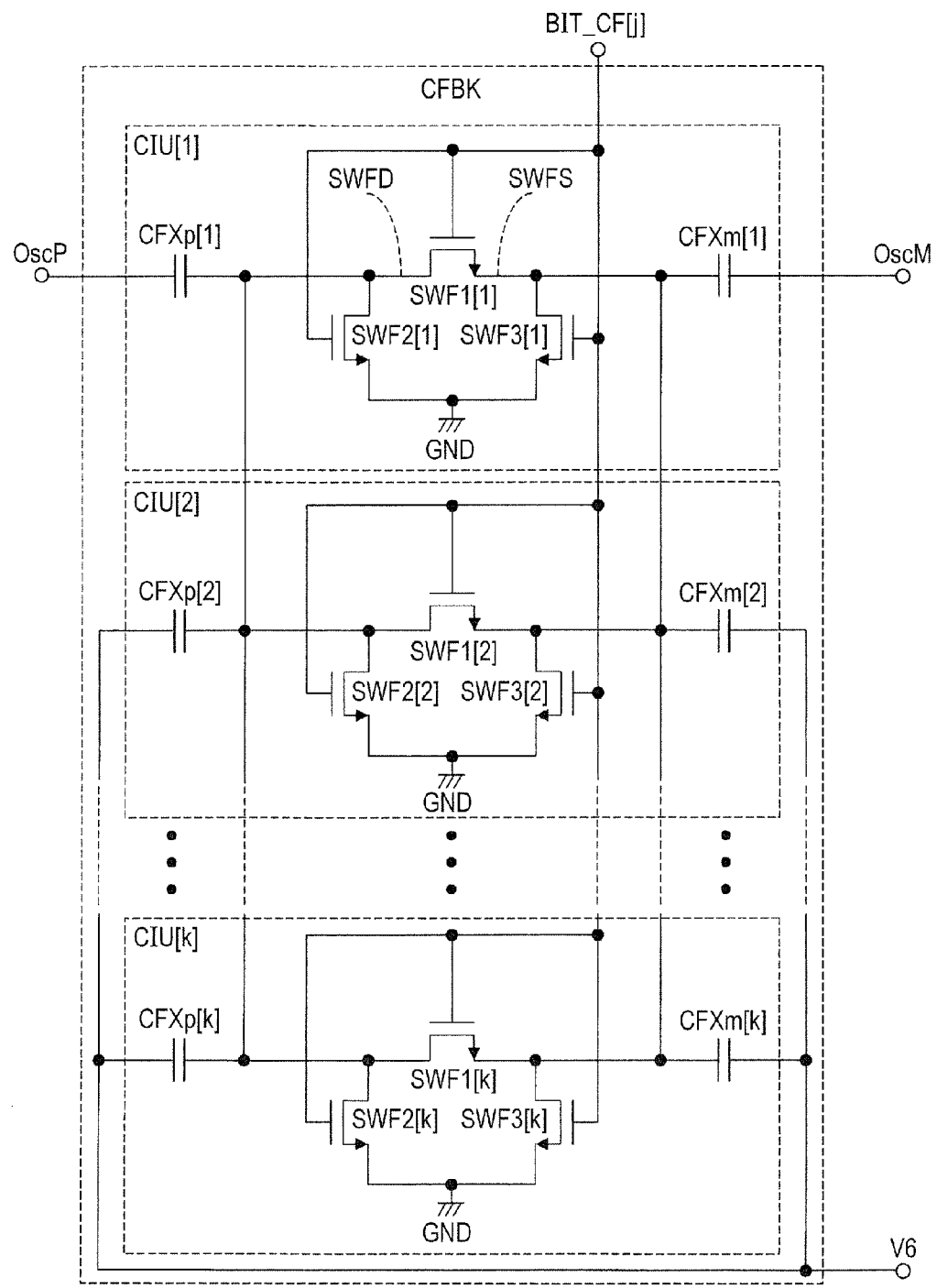
FIG. 3 is a circuit diagram showing a detailed configuration example of a fractional-value capacitor block in a capacitor bank (for fractional value) in the digitally controlled oscillator circuit of FIG. 1.

FIG. 3 is a circuit diagram showing a detailed configuration example of a fractional-value capacitor block in a capacitor bank (for fractional value) in the digitally controlled oscillator circuit of FIG. 1. The fractional-value capacitor block CFBK shown in FIG. 3 has k (where k: integer greater than or equal to 2) unitary capacitor units CIU[1] through CIU[k] each having the same circuit configuration as the unitary capacitor unit lying in the above integer-value capacitor bank CINT. As with the configuration example of FIG. 2, the unitary capacitor unit CIU[1] is equipped with capacitive elements CFXp[1] and CFXm[1] corresponding to the capacitive elements CIp and CIm of FIG. 2, and switches SWF1[1], SWF2[1] and SWF3[1] corresponding to the switches SWI1, SWI2 and SWI3 of FIG. 2. Likewise, the unitary capacitor unit CIU[k] is equipped with capacitive elements CFXp[k] and CFXm[k] corresponding to the capacitive elements CIp and CIm of FIG. 2, and switches SWF1[$k$], SWF2[$k$] and SWF3[$k$] corresponding to the switches SWI1, SWI2 and SWI3 of FIG. 2.

In the unitary capacitor units CIU[1] through CIU[k], a node SWFD on the switch side is coupled in common to the capacitive elements CFXp[1] through CFXp[k] on the oscillation output node OscP side. Likewise, a node SWFS on the switch side is coupled in common even to the capacitive elements CFXm[1] through CFXm[k] on the oscillation output node OscM side. On the other hand, only the capacitive element CFXp[1] in the capacitive elements CFXp[1] through CFXp[k] on the oscillation output node OscP side is coupled to the oscillation output node OscP at a node lying on the side opposite to the node SWFD on the switch side. The remaining capacitive elements CFXp[2] through CFXp[k] is coupled in common to a fixed voltage V6. Likewise, only the capacitive element CFXm[1] in the capacitive elements CFXm[1] through CFXm[k] on the oscillation output node OscM side is coupled to the oscillation output node OscM at a node lying on the side opposite to the node SWFS on the switch side. The remaining capacitive elements CFXm[2] through CFXm[k] are coupled in common to the fixed voltage V6. The fixed voltage V6 is an AC ground power supply voltage. Although not limited in particular, for example, the ground power supply voltages GND2 and GND1 or the like in FIG. 1 may be used. Turning on and off of the switches (SWF1[1], SWF2[2] and SWF3[1]) through (SWF1[$k$], SWF2[$k$] and SWF3[$k$]) is controlled in common by any one (BIT_CF[j]) of the on/off control lines BIT_CF in FIG. 1.

Figure 4:
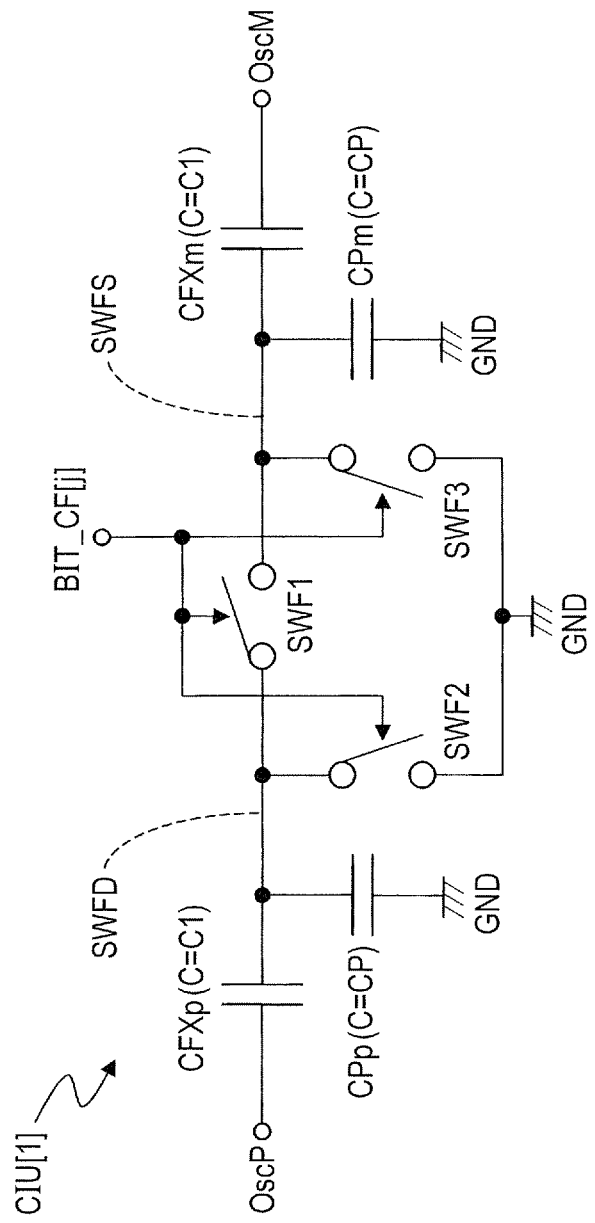
FIG. 4 is an explanatory diagram showing one example of the principle of operation of the fractional-value capacitor block of FIG. 3.
Figure 5A:
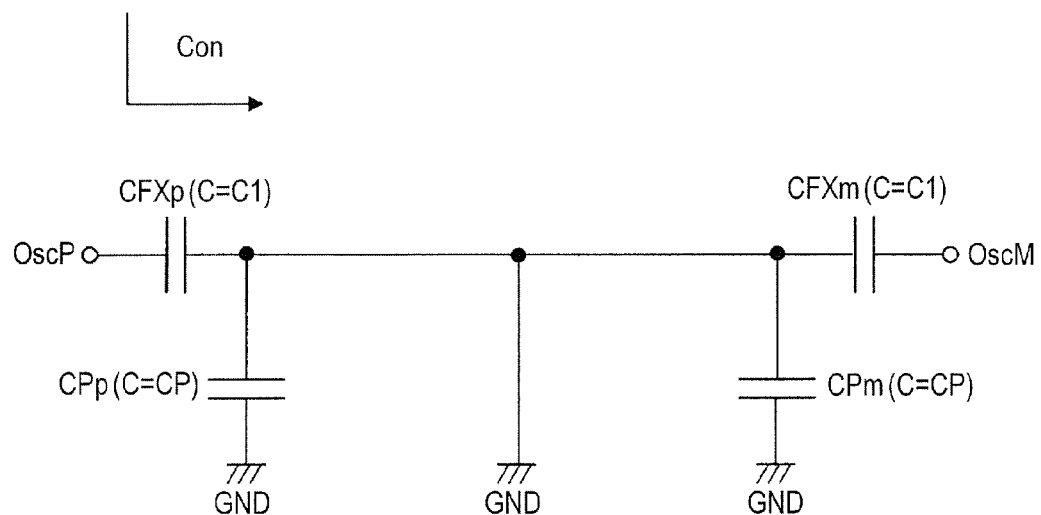
FIGS. 5A and 5B are respectively explanatory diagrams illustrating one example of the principle of operation of the fractional-value capacitor block of FIG. 3.
Figure 5B:
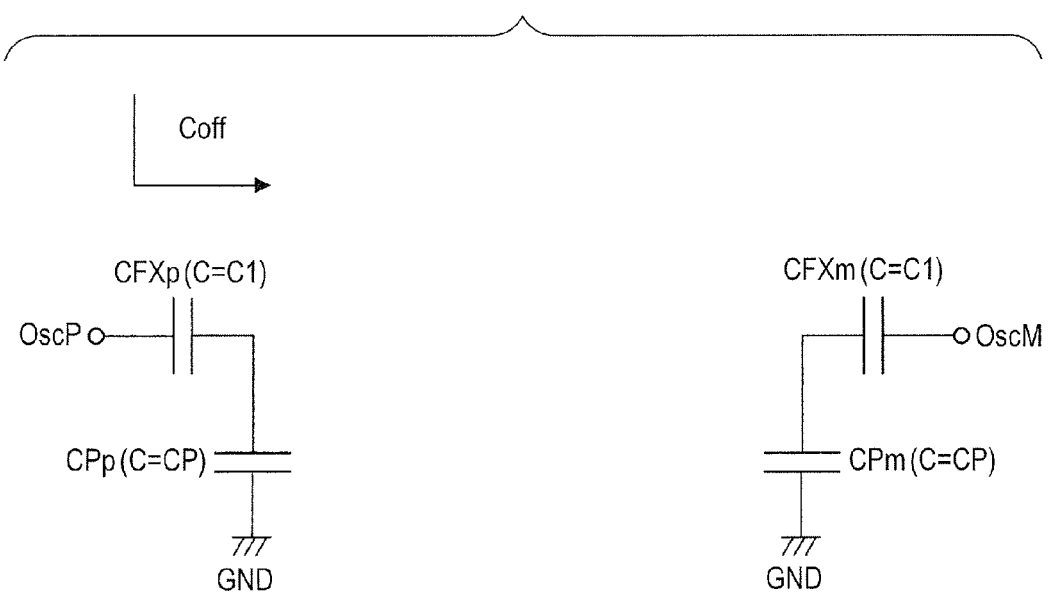

FIG. 4 and FIGS. 5A and 5B are respectively explanatory diagrams showing one example of the principle of operation of the fractional-value capacitor block of FIG. 3. The unitary capacitor unit CIU[1] of the unitary capacitor units CIU[1] through CIU[k] included in the fractional-value capacitor block CFBK of FIG. 3 is shown in FIG. 4. Here, the unitary capacitor unit CIU[1] is called a reference unitary capacitor unit as distinguished from the unitary capacitor units CIU[2] through CIU[k]. The reference unitary capacitor unit CIU[1] actually includes parasitic capacitances CPp and CPm in addition to the above-described capacitive elements CFXp and CFXm and switches SWF1 through SWF3 as shown in FIG. 4. The parasitic capacitance CPp exists between the node SWFD and the ground power supply voltage GND. The parasitic capacitance CPm exists between the node SWFS and GND. Here, the capacitance values of the capacitive elements CFXp and CFXm are both assumed to be C1, and the capacitance values of the parasitic capacitances CPp and CPm are both assumed to be CP.

An equivalent circuit taken where the switches SWF1 through SWF3 in FIG. 4 are all driven to on is shown in FIG. 5A. In this case, a capacitance value Con taken where the reference unitary capacitor unit CIU[1] side is seen from the oscillation output node OscP becomes Con=C1 because the node SWFD of FIG. 4 is coupled to GND. On the other hand, an equivalent circuit taken where the switches SWF1 through SWF3 in FIG. 4 are all driven to off is shown in FIG. 5B. In this case, a capacitance value Coff taken where the reference unitary capacitor unit CIU[1] side is seen from the oscillation output node OscP is expressed in the following equation (1) with the series coupling of the capacitive element CFXp and the parasitic capacitance CPp because the node SWFD of FIG. 4 is brought to high impedance. As a result, the amount of change ΔCint in the capacitance value with the turning on/off of the switches SWF1 through SWF3 is expressed in the following equation (2).

$$Coff = (C1 \cdot CP)/(C1+CP) \quad (1)$$

$$\Delta Cint = Con - Coff = C1^2/(C1+CP) \quad (2)$$

Now consider where CP of FIG. 5 is replaced with CP' and thereby the capacitance value of ΔCint is set to 1/K. That is, consider where the amount of change (equal to the amount of change at the unitary capacitor unit CIU in the capacitor bank CINT of FIG. 1) in the capacitance value at the reference unitary capacitor unit CIU[1] is defined as 1/K, and the resolution of the oscillation frequency is improved to K times (DCO gain is 1/K) that at the unitary capacitor unit CIU in the capacitor bank CINT. In this case, a target amount of change ΔCf is given by the following equation (3) using the equation (2). A relationship of the following equation (4) is derived from the equation (3).

$$\Delta Cf = C1^2/(C1+CP') = \Delta Cint/K = C1^2/(K \cdot (C1+CP)) \quad (3)$$

$$CP' = (K-1) \cdot C1 + K \cdot CP \quad (4)$$

As is understood from the equation (4), (K−1) C1 and K CPs may be coupled in parallel instead of the parasitic capacitance CPp (capacitance value CP) in FIGS. 5A and 5B in order to bring the capacitance value of ΔCint to 1/K. This is achieved by the above-described circuit configuration of FIG. 3. That is, in FIG. 3, (K−1) C1 associated with the capacitive elements CFXp[2] through CFXp[k] are coupled in parallel between the node SWFD and the fixed voltage V6 (=GND). Further, K CPs associated with the unitary capacitor units CIU[1] through CIU[k] are coupled in parallel to the node SWFD. Incidentally, although the OscP side has been explained by way of example herein, the OscM side is of course also similar to the above.

Thus, for example, a fractional-value capacitor block CFBK that realizes an amount of change in capacitance equivalent to ½ of ΔCint takes a configuration equipped with the unitary capacitor units CIU[1] and CIU[2] in FIG. 3. A fractional-value capacitor block CFBK that realizes an amount of change in capacitance equivalent to ¼ of ΔCint takes a configuration equipped with the unitary capacitor units CIU[1] through CIU[4]. Since the unitary capacitor units CIU[1] through CIU[4] have the same circuit configuration (substantially the same layout configuration) at this time, the capacitance values of the capacitive elements CFXp and CFXm thereof can be set to the same value (C1) and besides the capacitive values of the parasitic capacitances CPp and CPm can also be set to the same value (CP) with a high degree of accuracy. As a result, the resolution of the oscillation frequency, which is equivalent to K times that at the unitary capacitor unit CIU, can be achieved with a high degree of accuracy on the basis of the unitary capacitor unit CIU in the capacitor bank CINT. In addition to the various advantageous effects described in FIG. 1, for example, an improvement in DNL (Differential Non Linearity) and the like are achieved.

Figure 6:
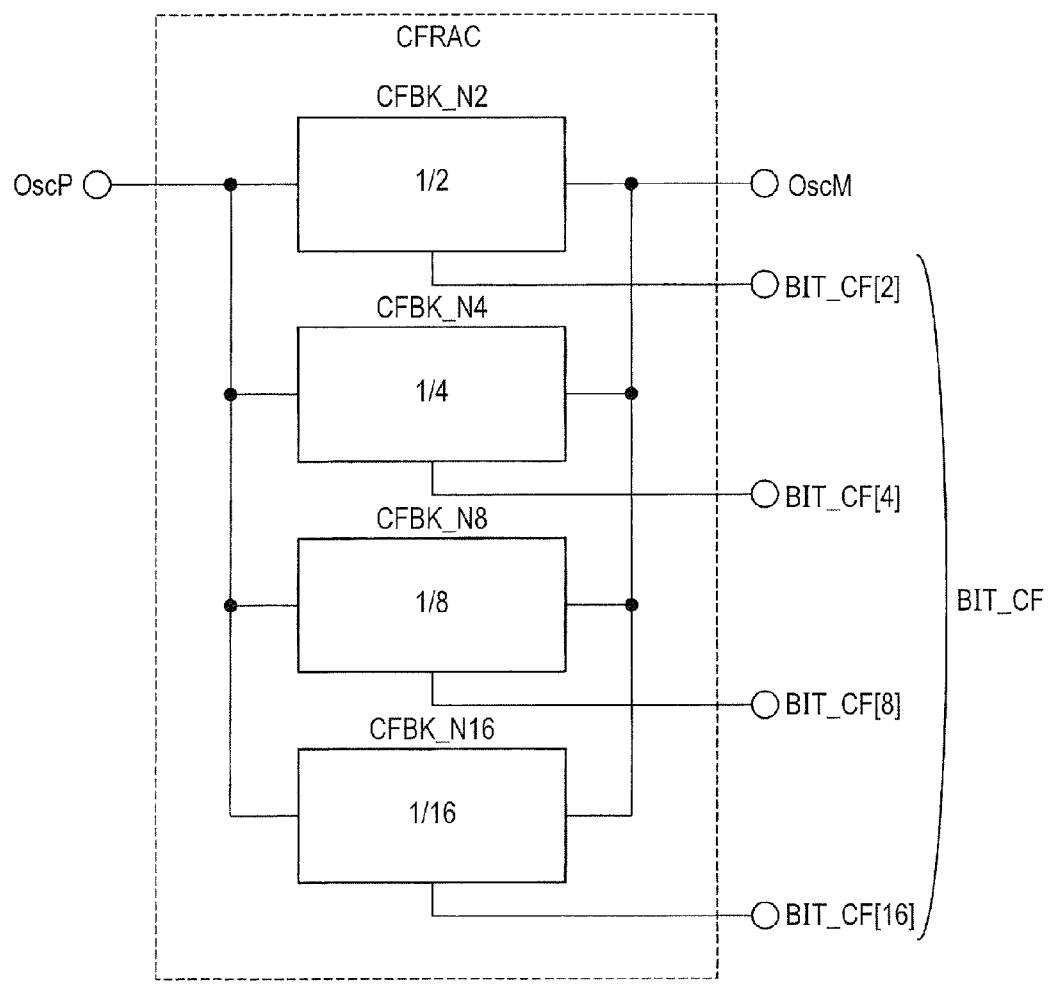
FIG. 6 is a block diagram showing a schematic configuration example of a capacitor bank (for fractional value) in the digitally controlled oscillator circuit of FIG. 1.

FIG. 6 is a block diagram showing a schematic configuration example of a capacitor bank (for fractional value) in the digitally controlled oscillator circuit of FIG. 1. The capacitor bank CFRAC shown in FIG. 6 includes a plurality (four herein) of fractional-value capacitor blocks CFBK_N2, CFBK_N4, CFBK_N8 and CFBK_N16 provided between the oscillation output nodes OscP and OscM. The fractional-value capacitor block CFBK_N2 realizes an amount of change equivalent to ½ of the amount of change in capacitance at each unitary capacitor unit CIU in the capacitor bank (for integer value) CINT. Concretely, the fractional-value capacitor block CFBK_N2 includes the unitary capacitor units CIU[1] and CIU[2] in FIG. 3. Their switches SWF1 ([1] [2]) through SWF3 ([1] [2]) are controlled by their corresponding on/off control line BIT_CF[2].

The fractional-value capacitor block CFBK_N4 realizes an amount of change equivalent to ¼ of the amount of change in capacitance at the unitary capacitor unit CIU in the capacitor bank CINT and includes the capacitor units CIU[1] through CIU[4] in FIG. 3. Likewise, the fractional-value capacitor block CFBK_N8 is provided with the capacitor units CIU[1] through CIU[8] in FIG. 3 to realize an amount of change equivalent to ⅛ of the amount of change in capacitance at the unitary capacitor unit CIU in the capacitor bank CINT. The fractional-value capacitor block CFBK_N16 includes the unitary capacitor units CIU[1] through CIU[16] in FIG. 3 to realize an amount of change equivalent to ¹⁄₁₆ of the amount of change in capacitance at the unitary capacitor unit CIU in the capacitor bank CINT. Respective switches in the fractional-value capacitor blocks CFBK_N4, CFBK_N8 and CFBK_N16 are controlled by their corresponding on/off control lines BIT_CF[4], BIT_CF[8] and BIT_CF[16].

Thus, assuming that, for example, an adjustment width or span of an oscillation frequency at the unitary capacitor unit CIU in the capacitor bank CINT is 10 kHz, an adjustment width of 0.625 (=10/16) kHz can be realized by on/off control by the on/off control line BIT_CF[16], and an adjustment width of 1.25 (=10/8) kHz can be realized by on/off control by the on/off control line BIT_CF[8]. For example, the on/off control by the on/off control line BIT_CF[16] and the on/off control by the on/off control line BIT_CF[8] are combined to thereby make it possible to realize an adjustment width of 1.875 (0.625+1.25) kHz. Subsequently, in like manner, the on/off control lines BIT_CF ([2], [4], [8] and [16]) are combined as appropriate, thereby making it possible to arbitrarily adjust between 10 kHz in 0.625 kHz units (16-step gradation). Incidentally, although the fractional-value capacitor blocks up to the fractional-value capacitor block CFBK_N16 for realizing (½⁴) have been provided herein, fractional-value capacitor blocks corresponding to (½ᴺ) (where N: integer greater than or equal to 5) are of course provided in like manner to thereby make it possible to sequentially achieve improvements in resolution.

<<Configuration (Comparative Example) of Capacitor Bank (for Fractional Value)>>

Figure 21A:
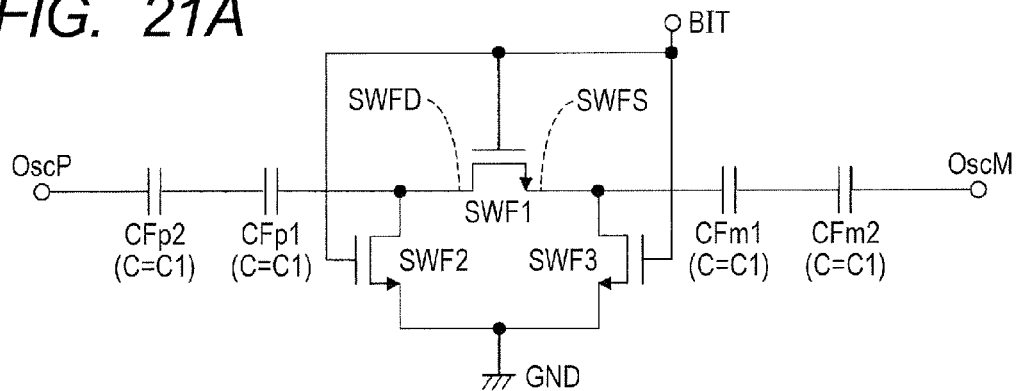
Figure 21B:
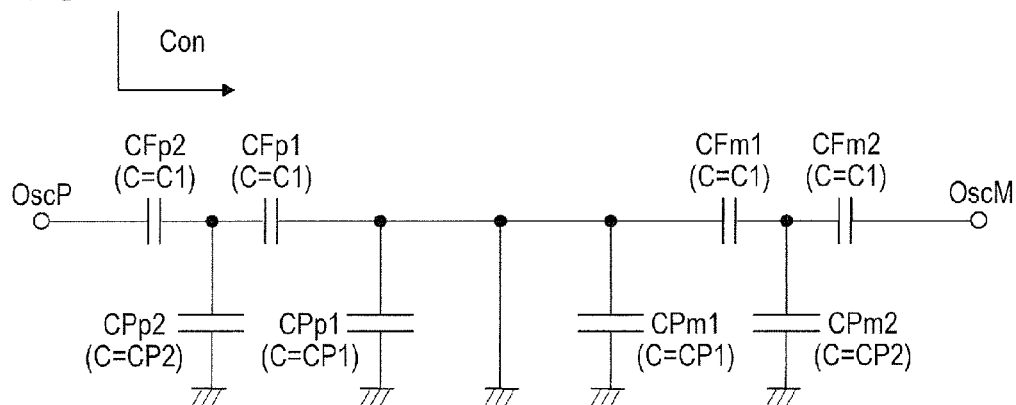
Figure 21C:
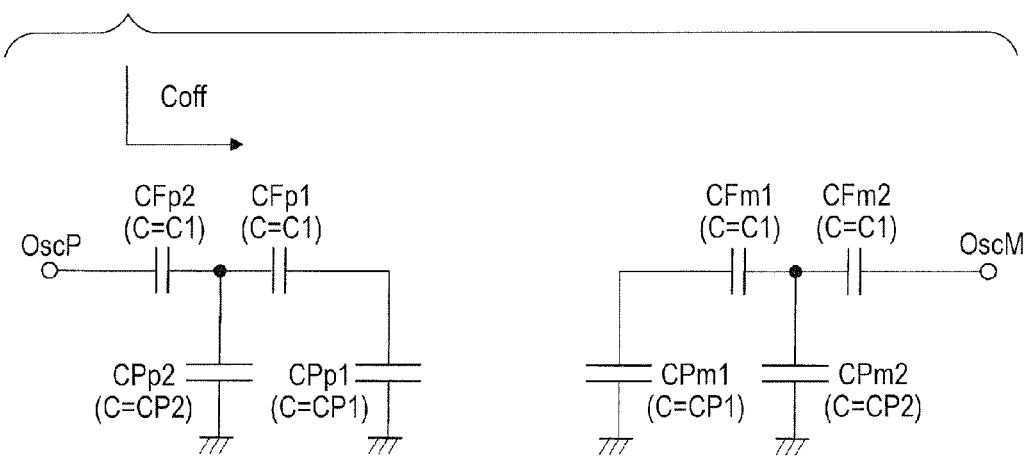

FIGS. 21A through 21C show a comparative example of the fractional-value capacitor block of FIG. 3, in which FIG. 21A is a circuit diagram illustrating a configuration example thereof, FIG. 21B is an equivalent circuit diagram taken where each switch is controlled to be on in FIG. 21A, and FIG. 21C is an equivalent circuit diagram taken where each switch is controlled to be off in FIG. 21A. As shown in FIG. 21A, there is considered, for example, a method of simply realizing a fraction of an amount of change in capacitance at each unitary capacitor unit in the capacitor bank CINT by series coupling of a plurality of capacitive elements. In the example of FIG. 21A, in order to realize a fraction of ½, for example, capacitive elements CFp2 and CFp1 are sequentially coupled between the oscillation output node OscP and the node SWFD on the switch side.

In the present method, when an amount of change $\Delta$Cf2 (=Con−Coff) between a capacitance value Con at the time that each switch is driven to on (in the case of FIG. 21B) and a capacitive value Coff at the time that each switch is driven to off (in the case of FIG. 21C) is determined as with the case of FIG. 3, the following equation (5) is obtained. In the equation (5), CP1 indicates the capacitance value of a parasitic capacitance CPp1 that exists in the node SWFD on the switch side, of the capacitive element CFp1. CP2 indicates the capacitance value of a parasitic capacitance CPp2 that exists in a node between the capacitive elements CFp1 and CFp2.

$$\Delta Cf2 = \frac{Cl^4}{(2 \cdot C1 + CP2)(C1^2 + (2 \cdot CP1 + CP2) + (CP1 \cdot CP2)} \tag{5}$$

On the other hand, the amount of change in capacitance at the unitary capacitor unit CIU in the capacitor bank CINT is given by $\Delta$Cint of the above equation (2). Thus, fining a solution with $\Delta$Cf2 as $\Delta$Cf2=(½)·$\Delta$Cint yields the following equation (6).

$$(4 \cdot CP1 + 3 \cdot CP2)C1^2 + CP1 \cdot CP2^2 = 2 \cdot CP \cdot C1^2 \tag{6}$$

One solution that satisfies the equation (6) is [CP1=CP/2] and [CP2=0]. The solution of the latter that brings the parasitic capacitance to zero is impossible in effect. The former means that CP1 is highly accurately set to ½ of CP (i.e., parasitic capacitance of unitary capacitor unit CIU in the capacitor bank CINT) inclusive of the parasitic capacitances for each wiring and switch. It can therefore be said that the former is very hard to use. Even if the solution can be adjusted by the size of each switch, it would vary due to a variation in device and a variation in temperature, thus making it hard to apply the solution to high frequency signal processing or the like that needs a high yield. Although there are solutions other than the above, both CP1 and CP2 need to be designed to less than or equal to CP. Eventually, it results in a problem of a relative variation between the corresponding capacitor unit and each unitary capacitor unit in the capacitor bank. On the other hand, if the method of FIG. 3 is used, a fractional capacitance is formed using a unitary capacitor unit CIU having the same configuration as the unitary capacitor unit CIU in the capacitor bank CINT. Therefore, a relative variation is reduced between the corresponding CIU and the unitary capacitor unit CIU in the capacitor bank CINT. Further, since a device variation every semiconductor chip also occurs substantially uniformly with respect to the unitary capacitor unit CIU in the capacitor bank CINT, a high-precision fractional capacitance can be realized.

<<Schematic Layout Configuration of Digitally Controlled Oscillator Circuit>>

Figure 7:
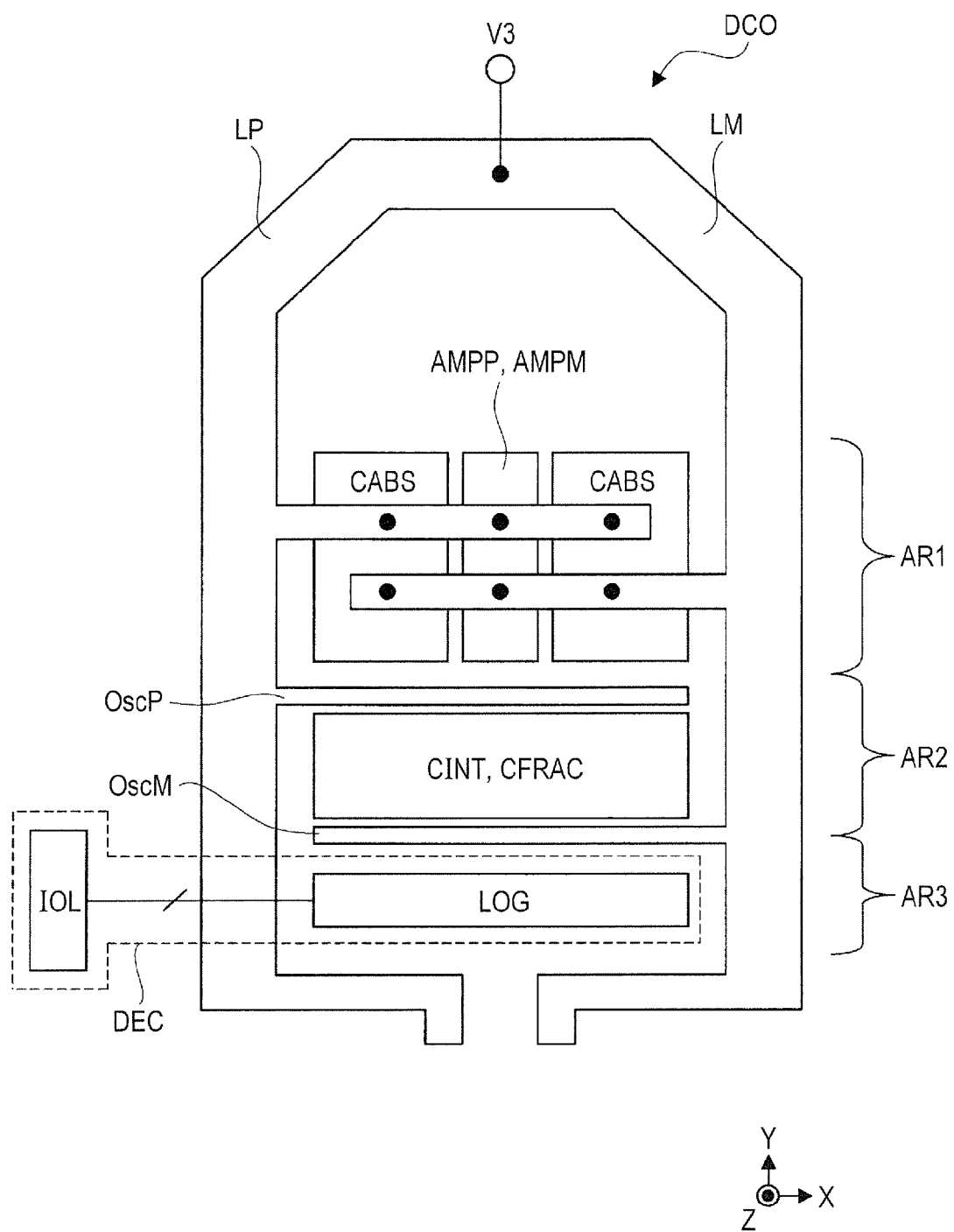
FIG. 7 is a plan view illustrating a schematic layout configuration example of the digitally controlled oscillator circuit included in the digitally controlled oscillator device according to the first embodiment of the present invention.

FIG. 7 is a plan view illustrating a schematic layout configuration example of the digitally controlled oscillator circuit included in the digitally controlled oscillator device according to the first embodiment of the present invention. Respective reference numerals shown in FIG. 7 respectively correspond to those shown in FIG. 1. The digitally controlled oscillator circuit DCO shown in FIG. 7 is shaped substantially in the form of a ring and provided with a metal wiring (LP, LM) disposed symmetrically about a Y axis. In the metal wiring, a fixed voltage (AC ground power supply voltage) V3 is applied to its middle point (center tap). With the center tap as the reference, a coil element LP is realized on one side, and a coil element LM is realized on the other side. A first area AR1, a second area AR2 and a third area AR3 are provided in order inside the ring in the Y-axis direction.

Capacitor banks CINT and CFRAC are disposed in the second area AR2, and a logic circuit LOG is disposed in the third area AR3. The logic circuit LOG configures the decoder circuit DEC of FIG. 1 inclusive of a logic control circuit IOL disposed outside the ring (LP, LM) and controls respective unitary capacitor units in the capacitor banks CINT and CFRAC according to control from the logic control circuit IOL. Here, the capacitor banks CINT and CFRAC are respectively configured by a plurality of unitary capacitor units CIUs having substantially the same layout as mentioned above. Although described in detail later, the capacitor bank CINT is configured by a part thereof and the capacitor bank CFRAC is configured by another part thereof. A wiring that branches off from the coil element LP and extends along an X-axis direction is disposed at one of both sides of the capacitor banks CINT and CFRAC as viewed in the Y-axis direction. A wiring that branches off from the coil element LM and extends along the X-axis direction is disposed at the other of both sides as viewed in the Y-axis direction. The former wiring assumes an oscillation output node OscP and the latter wiring assumes an oscillation output node OscM.

In the first area AR1, capacitor banks CABS are disposed in divided form on both sides with amplifier circuits AMPP and AMPM interposed therebetween as viewed in the X-axis direction. A wiring (i.e., OscP) that branches off from the coil element LP and extends along the X-axis direction, and a wiring (i.e., OscM) that branches off from the coil element LM and extends along the X-axis direction are disposed in a layer above the amplifier circuits AMPP and AMPM and the capacitor banks CABS as viewed in the Z-axis direction. The amplifier circuits AMPP and AMPM and the capacitor banks CABS are appropriately coupled to the wirings OscP and OscM. Here, the first area AR1 is arranged substantially in the middle portion of the ring (LP, LM) as viewed in the Y-axis direction. With this arrangement, the amplifier circuits AMPP and AMPM are arranged substantially in the center portion of the ring. With the arrangement of such amplifier circuits AMPP and AMPM, the resonant frequency in an LC circuit can be set as single, and an increase in the accuracy of an oscillation frequency, an improvement in the quality of an oscillation output signal, and the like can be achieved.

That is, assume where, for example, the amplifier circuits AMPP and AMPM are disposed at the ends (e.g., areas or the like that interpose the third area AR3 therebetween and are opposite to the second area AR2 in FIG. 7). In this case, the capacitor bank CABS has the largest capacity where the LC circuit side is seen from the amplifier circuits AMPP and AMPM. Therefore, a first LC circuit associated with the capacitor banks CABS, CINT and CFRAC and other portions of the coil elements LP and LM can be seen via some (wirings from the amplifier circuits AMPP and AMPM to the capacitor bank CABS) of the coil elements LP and LM. Therefore, a second series LC circuit associated with the above-described some and the capacitor banks CABS, CINT and CFRAC can be seen from the amplifier circuits AMPP and AMPM, thus resulting in the occurrence of an unnecessary resonant frequency. No problem arises where the unnecessary resonant frequency is sufficiently larger than the required resonant frequency, but the unnecessary resonant frequency becomes low as the distance between each of the amplifier circuits AMPP and AMPM and the capacitor bank CABS becomes long. It is thus necessary to bring the amplifier circuits AMPP and AMPM and the capacitor banks CABS as close to each other as possible. Since the amplifier circuits AMPP and AMPM are disposed substantially in the center portion of the ring (LP, LM) when such a layout configuration example as shown in FIG. 7 is used, the effect of such a difference in the perspective can be relaxed.

<<Layout Outline of Capacitor Bank (for Fractional Value)>>

Figure 8:
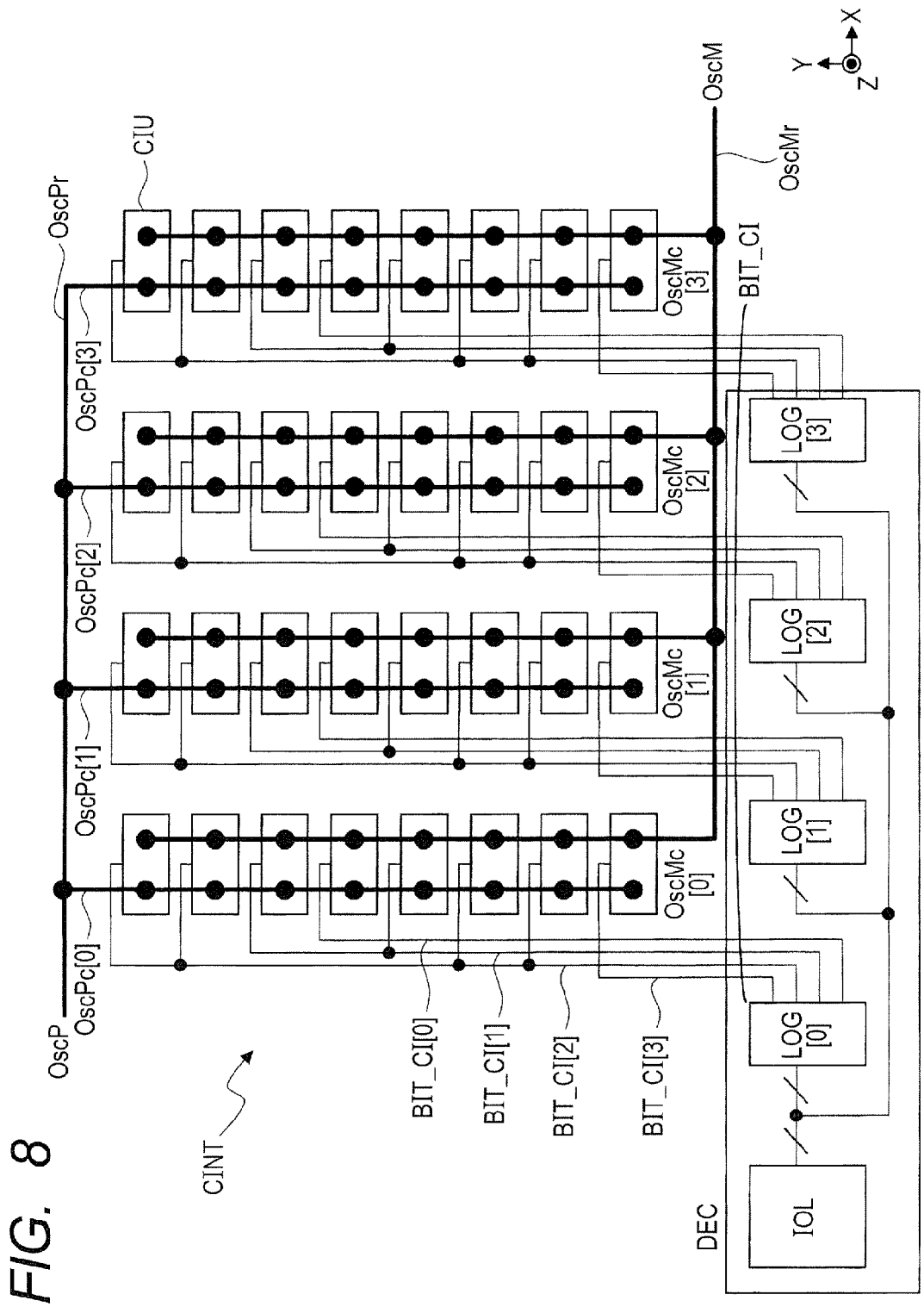
FIG. 8 is a typical diagram showing one example of a layout outline of the periphery of a capacitor bank (for integer value) in the digitally controlled oscillator circuit of FIG. 7.

FIG. 8 is a typical diagram showing one, example of a layout outline of the periphery of a capacitor bank (for integer value) in the digitally controlled oscillator circuit of FIG. 7. In the capacitor bank CINT shown in FIG. 8, 32 unitary capacitor units CIUs are arranged in a simplified fashion in the form of a matrix with 8 rows and 4 columns. However, the capacitor bank CINT is actually provided with, for example, 2048 CIUs with a matrix of 32 rows and 64 columns. In FIG. 8, an oscillation output node OscP includes an oscillation output node (oscillation output wiring) OscPr that extends along a row direction, and four oscillation output nodes (oscillation output wirings) OscPc[0] through OscPc[3] that branch off from the oscillation output node. OscPr at equal intervals and extend side by side along a column direction. Likewise, an oscillation output node OscM includes an oscillation output node (oscillation output wiring) OscMr that extends along the row direction, and four oscillation output nodes (oscillation output wirings) OscMc[0] through OscMc[3] that branch off from the oscillation output node OscMr at equal intervals and extend side by side along the column direction.

The oscillation output nodes OscPc[0] and OscMc[0] are arranged close to each other. Subsequently, in like manner, the oscillation output nodes OscPc[3] and OscMc[3] are also arranged close to each other. The oscillation output nodes OscPr and OscMr are provided on both sides with the thirty-two unitary capacitor units CIUs interposed therebetween in the column direction. The eight unitary capacitor units CIUs corresponding to the first column are sequentially arranged over wiring paths of the oscillation output nodes OscPc[0] and OscMc[0]. The respective unitary capacitor units CIUs are coupled to the oscillation output nodes OscPc[0] and OscMc[0]. Subsequently, in like manner, the eight unitary capacitor units CIUs corresponding to the fourth column are sequentially arranged over wiring paths of the oscillation output nodes OscPc[3] and OscMc[3]. The respective unitary capacitor units CIUs are coupled to the oscillation output nodes OscPc[3] and OscMc{3}.

A plurality (four herein) of on/off control lines BIT_CI[0] through BIT_CI[3] that extend side by side along the column direction are arranged in the neighborhood of the eight unitary capacitor units CIUs corresponding to the first column. Likewise even with respect to the second, third and fourth columns plurality (four herein) of on/off control lines that extend side by side along the column direction are arranged every column in the neighborhood of the eight unitary capacitor units CIUs that configure the respective columns. The on/off control lines corresponding to the first column are driven by a logic circuit LOG [0]. Subsequently, in like manner, the on/off control lines corresponding to the second, third and fourth columns are respectively driven by logic circuits LOG [1], LOG [2] and LOG [3]. The logic circuits LOG [0] through LOG [3] configure a decoder circuit DEC along with a logic control circuit IOL. The decoder circuit DEC is disposed along any (one side on the OscMr side herein) of the sides of a matrix area of the unitary capacitor units CIUs.

Aiming at the eight unitary capacitor units CIUs included in the first column, the logic circuit LOG [0] controls one unitary capacitor unit CIU using the on/off control line BIT_CI[0], controls the two CIUs using the on/off control line BIT_CI[1], controls the four, unitary capacitor units CIUs using the on/off control line BIT_CI[2], and controls one unitary capacitor unit CIU using the on/off control line BIT_CI[3]. Specifically, the logic circuit LOG [0] controls in common on/off of the switches (SWI1 through SWI3 of FIG. 2) included in the two unitary capacitor units CIUs using the on/off control line BIT_CI[1], for example. Accordingly, if, for example, only the on/off control line BIT_CI[0] is driven to an on level, one capacitive element (CIp, CIm of FIG. 2) is added to each of the oscillation output nodes OscPc[0] and OscMc[0]. If only the on/off control line BIT_CI[1] is driven to the on level, two capacitive elements are added to the oscillation output nodes OscPc[0] and OscMc[0] respectively. Further, if the on/off control lines BIT_CI[0] and BIT_CI[1] are driven to the on level, three capacitive elements are added to the oscillation output nodes OscPc[0] and OscMc[0] respectively. Subsequently, in like manner, four to eight capacitive elements can respectively be added to the oscillation output nodes OscPc[0] and OscMc[0] by appropriately combining the on and off level's of the on/off control lines BIT_CI[0] through BIT_CI[3].

The logic circuits LOG [2] and LOG [3] are also similar to the above. For example, the logic circuit LOG [3] suitably combines the on and off levels of the on/off control lines BIT_CI[0] through BIT_CI[3] to thereby make it possible to suitably add zero to eight capacitive elements to the oscillation output nodes OcsPc[3] and OscMc[3]. The logic control circuit IOL selects any of the logic circuits LOG [0] through LOG [3] to give instructions as to the on and off levels of the on/off control lines BIT_CI[0] through BIT_CI[3] and give a command for driving the entire on/off control lines BIT_CI [0] through BIT_CI[3] to the on or off level to the logic circuits LOG [0] through LOG [3]. Thus, for example, when the nine capacitive elements are added to the oscillation output nodes OscP and OscM, the logic circuit LOG [1] may be selected in a state in which the entire on/off control lines BIT_CI[0] through BIT_CI[3] have been driven to the on level at the logic circuit LOG [0], and only the on/off control line BIT_CI[0] may be driven at the logic circuit LOG [1].

<<Layout Outline of Capacitor Bank (for Fractional Value)>>

Figure 9:
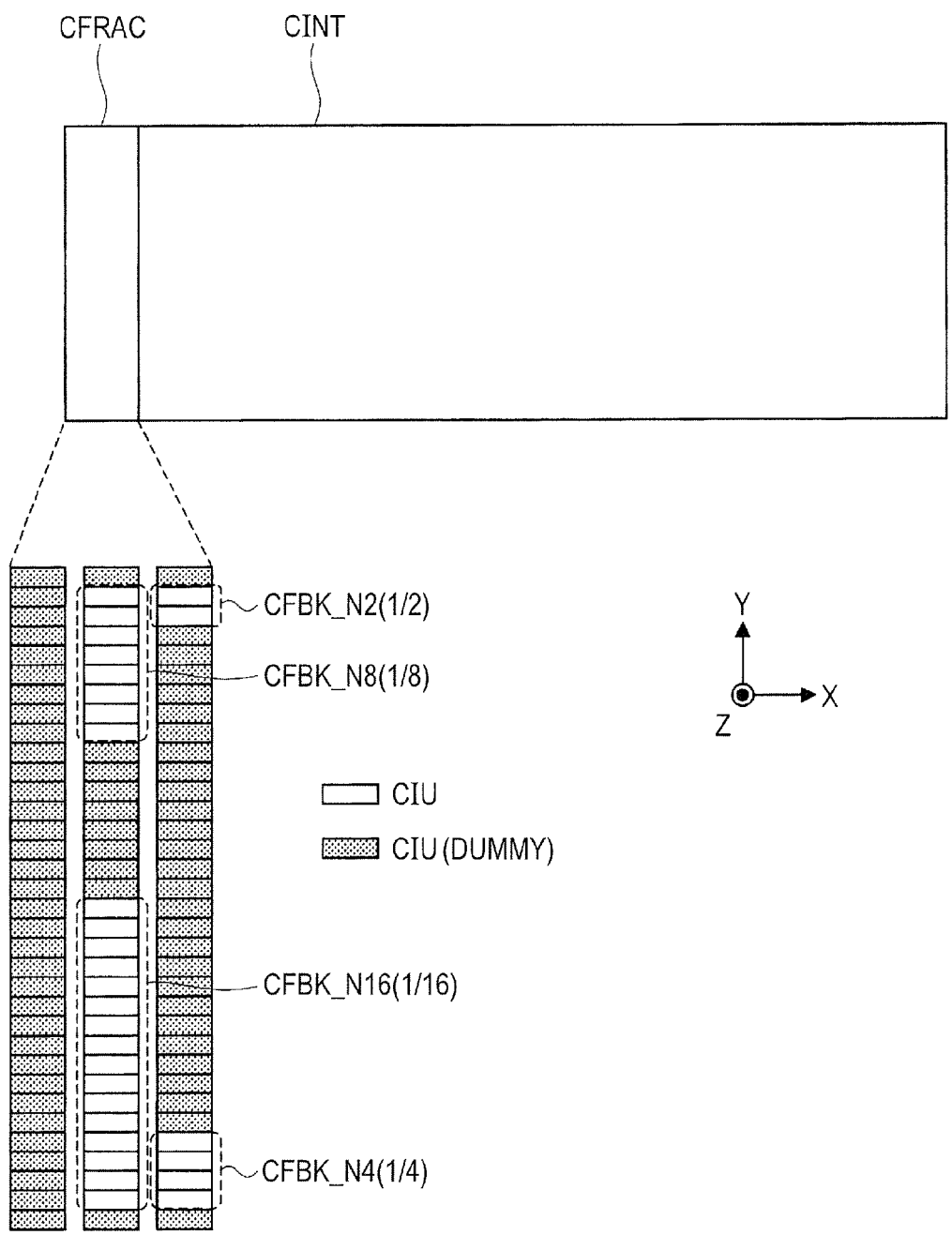
FIG. 9 is a typical diagram depicting one example of a layout outline of a capacitor bank (for fractional value) in the digitally controlled oscillator circuit of FIG. 7.

FIG. 9 is a typical diagram showing one example of a layout outline of a capacitor bank (for fractional value) in the digitally controlled oscillator circuit of FIG. 7. In the example of FIG. 9, the capacitor bank CFRAC for the fractional value is disposed adjacent to the capacitor bank CINT for the integer value. In other words, as shown in FIG. 8, the unitary capacitor units are disposed in matrix form, and the capacitor bank CINT is configured by a partial area thereof and the capacitor bank CFRAC is configured by another partial area. Thus, as described even in FIG. 21 and the like, a relative process variation can be reduced between each unitary capacitor unit CIU in the capacitor bank CINT and each unitary capacitor unit CIU in the capacitor bank CFRAC, and the effect of a device variation every semiconductor chip can be suppressed. In this viewpoint, the capacitor bank CFRAC is not necessarily required to be disposed at the end of the capacitor bank CINT as in the example of FIG. 9, but can be changed as appropriate.

The capacitor bank CFRAC has been realized herein using CIUs arranged in 34 rows×3 columns. Since the first column is however used as a dummy, and the first and thirty-fourth rows are also used as dummies, the capacitor bank CFRAC is substantially represented in 32 rows×2 columns. The dummies are provided, for example, to keep layout patterns (pattern densities) around the respective unitary capacitor units CIUs uniform with respect to the unitary capacitor units CIUs and provided to suppress such a situation that a fluctuation in manufacture occurs depending on each peripheral pattern. Incidentally, the above capacitor bank CINT is also similar to the above and is actually provided with dummies at end's rows and end's columns.

In the capacitor bank CFRAC, the fractional-value capacitor block CFBK_N8 of FIG. 6 is formed using the eight unitary capacity units CIUs corresponding to the second through ninth rows with respect to the unitary capacitor units CIUs corresponding to the second column. The fractional-VALUE capacitor block CFBK_N16 of FIG. 6 is formed using the sixteen unitary capacitor units CIUs of the eighteenth through thirty-third columns with respect to the unitary capacitor units CIUs corresponding to the second column. The fractional-value capacitor block CFBK_N2 of FIG. 6 is formed using the two unitary capacitor units CIUs corresponding to the second and third rows with respect to the unitary capacitor units CIUs corresponding to the third column. The fractional-value capacitor block CFBK_N4 of FIG. 6 is formed using the four unitary capacitor units CIUs of the thirtieth to thirty-third rows with respect to the unitary capacitor units CIUs corresponding to the third column. Incidentally, the unitary capacitor units CIUs corresponding to the remaining rows become dummies at the second and third columns.

Figure 10:
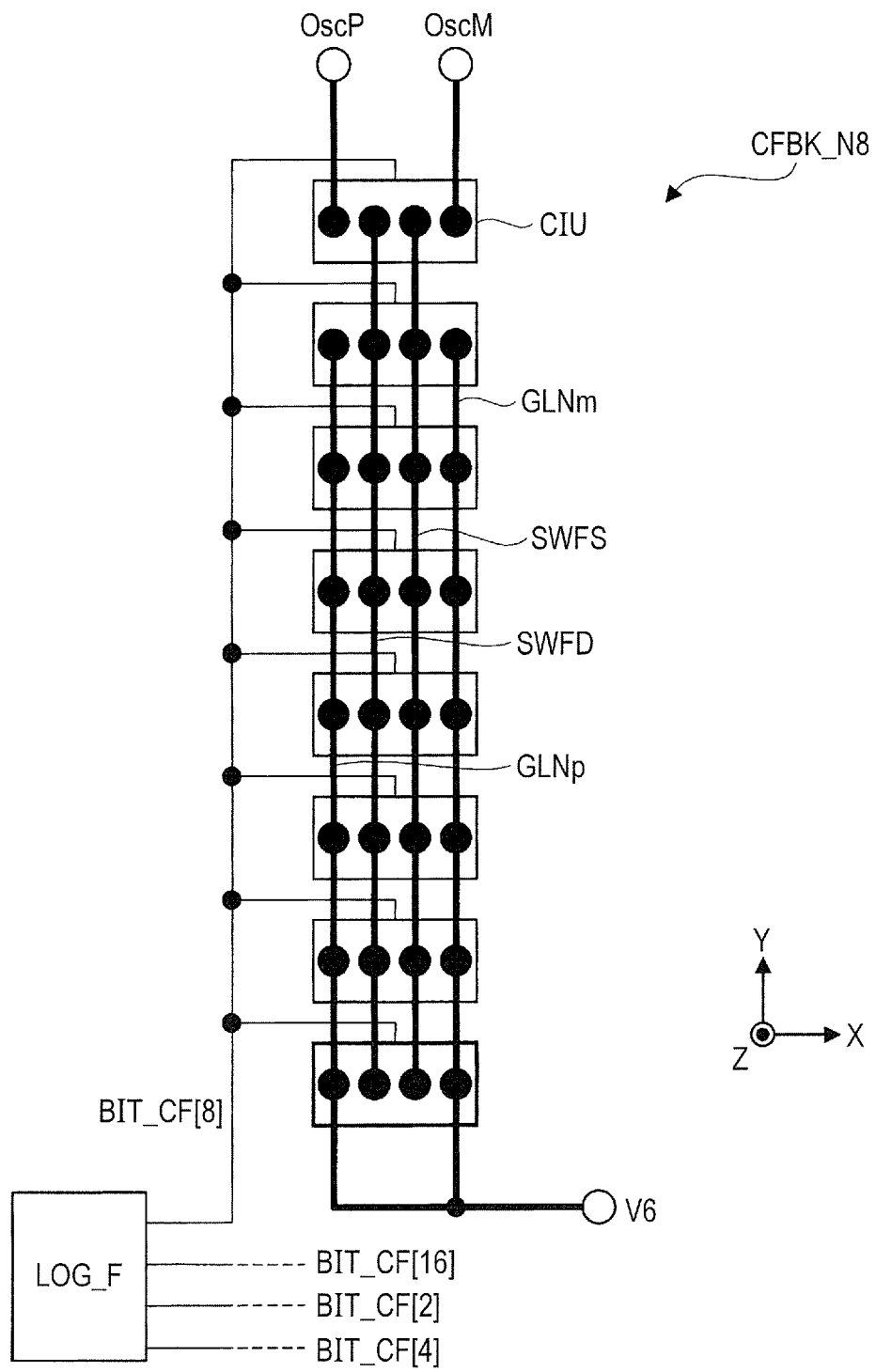
FIG. 10 is a typical diagram showing one example of a layout outline of the periphery of a fractional-value capacitor block (for ⅛) in FIG. 9.

FIG. 10 is a typical diagram showing one example of a layout outline of the periphery of a fractional-value capacitor block (for ⅛) in FIG. 9. As shown in FIG. 10, for example, the fractional-value capacitor block CFBK_N8 is configured by the eight unitary capacitor units CIUs sequentially arranged side by side over the same column. Here, the unitary capacitor unit CIU corresponding to the fist row in FIG. 10 becomes the reference unitary capacitor unit (CIU[1] of FIG. 3) described in FIG. 3. One ends of two capacitive elements (corresponding to the capacitive elements CFXp and CFXm of FIG. 3) are respectively coupled to oscillation output nodes OscP and OscM. On the other hand, in each of the unitary capacitor units CIUs corresponding to the second through eighth rows in FIG. 10, one end of one of two capacitive elements is coupled to a wiring GLNp that extends in a column direction, and one end of the other of the two capacitive elements is coupled to a wiring GLNm that extends in the column direction. The two wirings GLNp and GLNm serve as wirings for a fixed voltage (AC ground power supply voltage) V6.

In each of the unitary capacity units CIUs corresponding to the first through eighth rows in FIG. 10, the other end of one (CFXp side) of the two capacitive elements is coupled in common to a wiring (node SWFD) that extends along the column direction. The other end of the other (CFXm side) of the two capacitive elements is also coupled in common to a wiring (node SWFS) that extends along the column direction. Switches (corresponding to the switches SWF1 through SWF3 of FIG. 3) included in the unitary capacitor units CIUs corresponding to the first through eighth rows are controlled in common by an on/off control line BIT_CF[8] that extends along the column direction. The on/off control line BIT_CF [8] is driven by a fractional-value logic circuit LOG_F. The fractional-value logic circuit LOG_F is disposed within the logic circuit LOG shown in FIG. 7 by way of example and drives even other on/off control lines BIT_CF ([16], [2] and [4]) in addition to the on/off control line BIT_CF[8].

Here, the unitary capacitor unit CIU (reference unitary capacitor unit CIU[1] of FIG. 3) corresponding to the first row in FIG. 10 corresponds to the unitary capacitor unit CIU corresponding to the second row and column in FIG. 9. Likewise, the reference unitary capacitor unit of the fractional-value capacitor block CFBK_N2 in FIG. 9 corresponds to the unitary capacitor unit CIU corresponding to the second row. The reference unitary capacitor unit of the fractional-value capacitor block CFBK_N16 in FIG. 9 corresponds to the unitary capacitor unit CIU corresponding to the thirty-third row in FIG. 9. Likewise, the reference unitary capacitor unit of the fractional-value capacitor block CFBK_N4 in FIG. 9 also corresponds to the unitary capacitor unit CIU corresponding to the thirty-third row. Thus, the reference unitary capacitor units of the respective fractional-value capacitor blocks CFBK are arranged in the end's rows except for the dummies, so that the nodes of the dummies (dummies located between the fractional-value capacitor blocks CFBK_N8 and CFBK_N16 in FIG. 9, for example) at the middle row can be coupled to the fixed voltage V6 of FIG. 3, for example, thus making it possible to reduce extra parasitic capacitances generated due to the dummies.

<<Detailed Configuration of Periphery of Unitary Capacitor Unit>>

Figure 11:
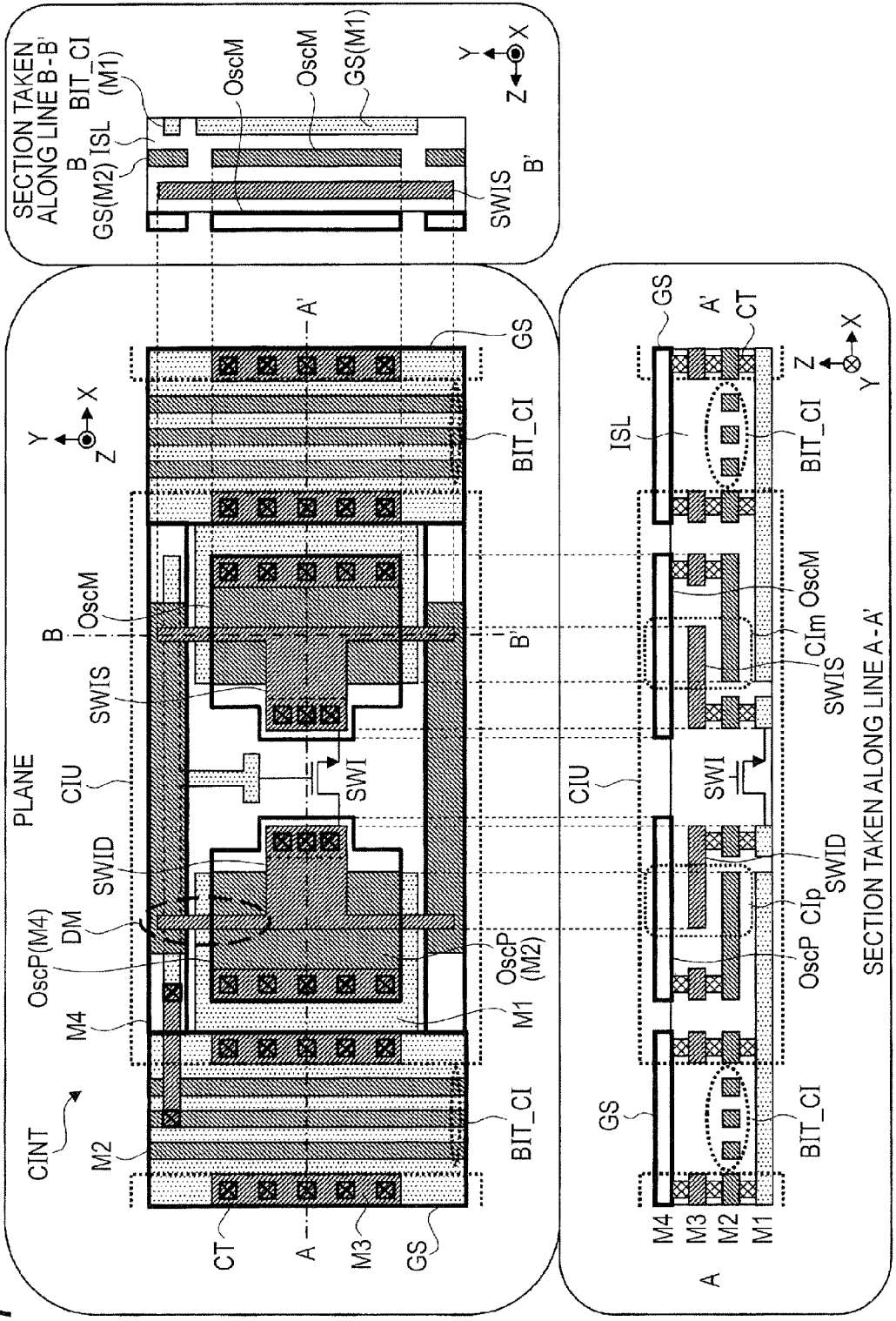
FIG. 11 is a plan view and a sectional view showing in the layout outline of FIG. 8, a detailed layout configuration example of the periphery of each unitary capacitor unit therein and a device sectional structure example thereof.
Figure 12:
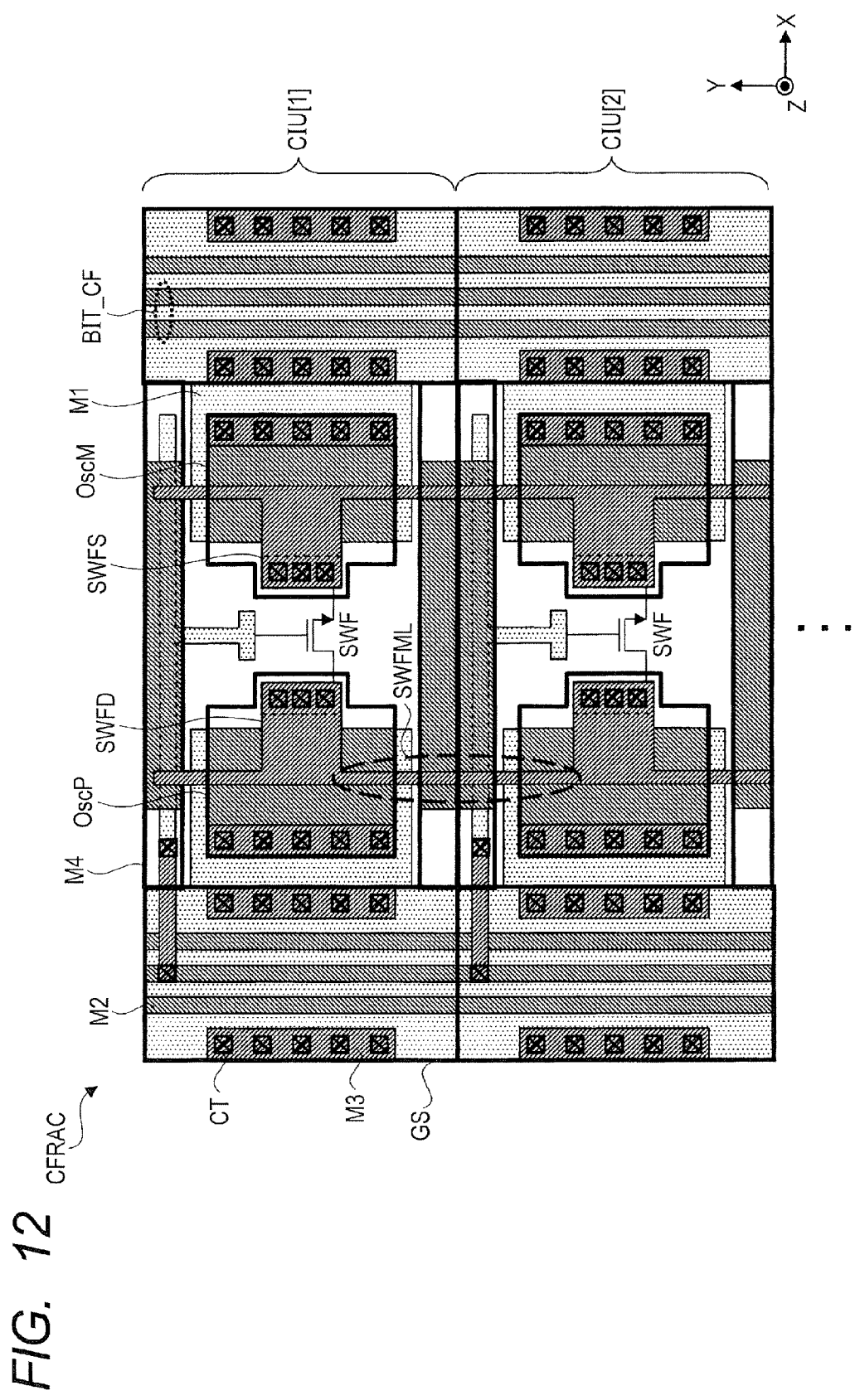
FIG. 12 is a plan view showing a detailed layout configuration example of the periphery of each unitary capacitor unit in the layout outline of FIG. 10.

FIG. 11 is a plan view and a sectional view showing in the layout outline of FIG. 8, a detailed layout configuration example of the periphery of each unitary capacitor unit therein and a device sectional structure example thereof. FIG. 12 is a plan view showing a detailed layout configuration example of the periphery of each unitary capacitor unit in the layout outline of FIG. 10. A unitary capacitor unit. CIU included in the integer-value capacitor bank CINT is shown in FIG. 11. Each unitary capacitor unit CIU included in the fractional-value capacitor bank CFRAC is shown in FIG. 12.

First, in FIG. 11, respective reference numerals in the unitary capacitor unit CIU respectively correspond to the above-described reference numerals shown in FIG. 2. As to respective reference numerals not shown in FIG. 2, M1, M2, M3 and M4 respectively indicate first, second, third and fourth metal wiring layers, CT indicate contact layers that appropriately couple between the metal wiring layers, and ISL indicates an insulating film that covers the metal wiring layers. Although the portions of the metal wiring layers are shown in extracted form in the sectional views (corresponding to the section taken along line A-A' and the section taken along line B-B') shown in FIG. 11, a semiconductor substrate actually exists in its lower layer (Z-axis direction).

In the plan view of FIG. 11, a plurality (three simply displayed herein) of on/off control lines BIT_CI that extend side by side along a Y-axis direction (column direction) are disposed on both sides that interpose a single unitary capacitor unit CIU therebetween in an X-axis direction (row direction). The on/off control lines BIT_CI control the unitary capacitor unit CIU disposed adjacent to one side (right side herein) as viewed in the X-side direction. In the unitary capacitor unit CIU, as shown in the sectional view taken along line A-A', capacitive element CIp is formed on one side and a capacitive element CIm is formed on the other side with a switch SWI (whose detailed structure example is omitted herein) interposed therebetween as viewed in the X-axis direction. The capacitive element CIp is provided with a node SWID formed by the third metal wiring layer M3. The node SWID is coupled to one end (concretely unillustrated drain diffusion layer in the semiconductor substrate) of the switch SWI through the contact layers CT and the first and second metal wiring layers M1 and M2.

The layer (M4) above the node SWID and the layer (M2) therebelow as viewed in the Z-axis direction are respectively formed with oscillation output nodes OscP through the insulating film ISL. The oscillation output nodes OscP for the upper and lower layers M4 and M2 are coupled via the contact layers CT and the third metal wiring layer M3. Thus, as shown in the plan view of FIG. 11, a part of the capacitive element CIp is formed by a portion at which the node SWID and the oscillation output node OscP (M4) overlap, whereas another part thereof is formed by a portion at which the node SWID and the oscillation output node OscP (M2) overlap. That is, the capacitive element CIp is configured by parallel coupling of two capacitive elements. Of course, the oscillation output node OscP can however also be formed of only either one of the metal wiring layers M4 and M2. Such a capacitive element CIp may be called an MOM capacitor in a sense that a portion of an insulating film (I) at an MIM capacitor is formed using an interlayer insulating film (typically silicon oxide film) of a normal metal wiring layer.

In the plan view of FIG. 11 and the sectional view taken along line A-A' in FIG. 11, the three on/off control lines BIT_C1 each formed by the second metal wiring layer M2 are arranged in a place (left side herein) adjacent to the unitary capacitor unit CIU as viewed in the X-axis direction. Here, the on/off control lines BIT_CI have peripheries covered with the above shield sections GS as is understood from the sectional view taken along line A-A'. That is, with the on/off control lines BIT_CI as the reference, the lower and upper layers as viewed in the Z-axis direction are covered with wirings (GS) for the first and fourth metal wiring layers M1 and M4, and the right and left as viewed in the X-axis direction are covered with the contact layers CT that couple between the first and fourth metal wiring layers M1 and M4, and wirings (GS) for the second and third layers M2 and M3. As shown in the plan view of FIG. 11, the wirings for the second and third metal wiring layers M2 and M3 respectively have some degree of length as viewed in the Y-axis direction. The length is equivalent to the length of each of the oscillation output nodes OscP (M4) and OscP (M2) as viewed in the Y-axis direction. Thus, the shield is included between the on/off control lines BIT_CI and the oscillation output nodes OscP disposed outside the unitary capacitor unit CIU. As a result, direct coupling connections between the on/off control lines BIT_CI and the oscillation output node OscP are reduced. For example, such a situation that the impedance of the oscillation output node OscP varies at random according to the driven state of each on/off control line BIT_CI can be suppressed and hence an improvement in DNL and like can be achieved.

As shown in the plan view of FIG. 11, any one (located in the middle herein) of the three on/off control lines BIT_CI is coupled to its corresponding wiring for the third metal wiring layer M3 by the contact layers CT. The wiring for the third metal wiring layer M3 extends toward the unitary capacitor unit CIU adjacent thereto in the X-axis direction. The wiring for the third metal wiring layer M3 is coupled to the wiring for the first metal wiring layer M1 through the contact layers CT and the second layer M2 within the unitary capacitor unit CIU. The wiring for the first metal wiring layer M1 extends along the X-axis direction and is thereafter coupled to a gate of the switch SWI (NMOS transistor). Here, as understood from the sectional view taken along line B-B' and the plan view, the wiring (i.e., BIT_CI) for the first metal wiring layer M1 is protected by its corresponding shield section GS (M1) comprised of the first metal wiring layer M1 as viewed in the Y-axis direction and protected by its corresponding shield section GS (M2) comprised of the second metal wiring layer M2 as viewed in the Z-axis direction. Thus, as understood from the sectional view taken along line B-B' and the plan view, the shield is included between the on/off control lines BIT_CI and the oscillation output nodes OscP and OscM arranged within the unitary capacitor unit CIU.

On the other hand, in FIG. 12, respective reference numerals in the unitary capacitor units CIU[1] and CIU[2] respectively correspond to the above reference numerals of FIG. 3. Reference numerals not shown in FIG. 3 are similar to the case of FIG. 11. A layout shown in FIG. 12 is illustrated as such a configuration example that the configuration example (plan view) of the unitary capacitor unit CIU shown in FIG. 11 is connected in the form of two in the Y-axis direction, and one of such configuration examples is defined as CIU[1] and the other thereof is defined as CIU[2]. With the difference between the capacitor banks CINT and CFRAC, however, the nodes SWID and SWIS are changed to nodes SWFD and SWFS, the switch SWI is changed to switches SWFs, and the on/off control lines BIT_CI are changed to on/off control lines BIT_CF. Incidentally, although three on/off control lines BIT_CF are disposed on one side with each unitary capacitor unit CIU interposed therebetween, the number of on/off control lines may be two in the example of FIG. 9, and the remaining one may be a dummy or the like, for example.

Here in the capacitor bank CFRAC, as shown in FIG. 12, the nodes SWFD of the unitary capacitor units CIU[1] and CIU[2] are coupled in common by a metal wiring SWFML of a third metal wiring layer M3 that extends along the Y-axis direction. Likewise, the nodes SWFS of the unitary capacitor units CIU[1] and CIU[2] are also coupled in common by the metal wiring of the third metal wiring layer M3. On the other hand, such a metal wiring SWFML is originally unnecessary for the capacitor bank CINT. With existence of the metal wiring SWFML, however, the capacitance values of the capacitive elements (CIp of FIG. 2 and CFXp of FIG. 4) and the capacitance value of the parasitic capacitance (CPp of FIG. 4) are different from each other between the unitary capacitor unit CIU in the capacitor bank CINT and each unitary capacitor bank CIU the capacitor bank CFRAC. Thus, in the first embodiment, a dummy metal wiring DM of the third metal wiring layer M3, which reflects the metal wiring SWFML of FIG. 12, is provided even in the unitary capacitor unit CIU in the capacitor bank CINT as shown in FIG. 11. Consequently, the unitary capacitor unit CIU in the capacitor bank CINT and each unitary capacitor unit CIU in the capacitor bank CFRAC have substantially the same (approximately same) layout configuration. It is thus possible to achieve an increase in accuracy upon the use of the fractional capacitance.

The configuration around each unitary capacitor unit CIU shown in each of FIGS. 11 and 12 has a feature even in that the wiring for the first metal wiring layer M1 is provided in a wide area at the layer below the on/off control lines BIT_CI and the oscillation output nodes (M2) lying outside the unitary capacitor unit CIU as understood from the plan view and the sectional view taken along line A-A' in FIG. 11, in addition to the features of the above-described dummy metal wiring DM and shield sections GS for the on/off control lines. Although the wiring for the first metal wiring layer M1 serves as the shield section GS, it is also equipped with the function of shielding against noise from the unillustrated semiconductor substrate in addition to the function of shielding between each on/off control line BIT_CI and the oscillation output node OscP. Consequently, an improvement in the quality of the oscillation output signal can be realized, thus resulting in the contribution, even to an improvement in DNL.

Incidentally, as to the structure of the capacitive element CIm shown in the sectional view taken along line A-A' and the plan view in FIG. 11, it takes such a structure that the above structure of capacitive element CIp is folded back symmetrically about the Y-axis, and its detailed description will therefore be omitted. Although the configuration of the periphery of one unitary capacitor unit CIU has been shown in FIG. 11, for example, there is actually provided such a configuration that as shown in FIG. 8, the unitary capacitor unit CIU of FIG. 11 is disposed in plural numbers (eight in the example of FIG. 8) in the Y-axis direction, and the oscillation output nodes OscP and OscM lying within the respective unitary capacitor units CIUs are respectively coupled to each other by the common wirings (e.g., the oscillation output nodes OscPc[0], OscMc[0] and so on in FIG. 8). In this case, although not limited in particular, the common wirings are formed by, for example, a fifth metal wiring layer (not shown) located in a layer above the fourth metal wiring layer M4 in FIG. 11. Although not limited in particular, the oscillation output nodes OscPr and OscMr of FIG. 8 and the oscillation output nodes OscP and OscM of FIG. 7 corresponding thereto are formed by, for example, a sixth metal wiring layer (not shown) located in a layer above the fifth metal wiring layer along with the coil elements LP and LM of FIG. 7.

<<Schematic Configuration of Digitally PLL Circuit>>

Figure 13:
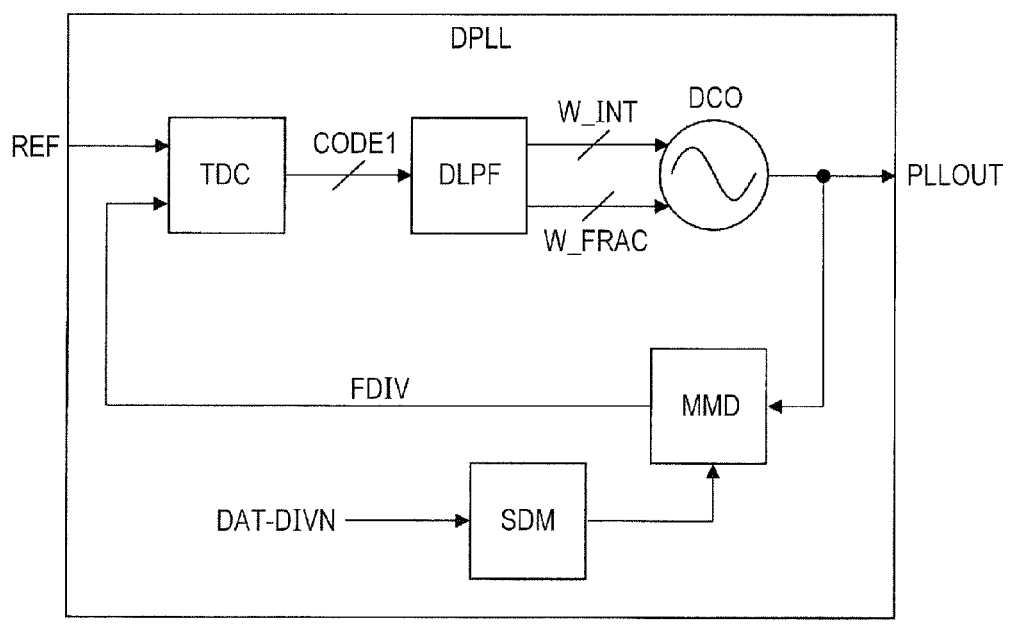
FIG. 13 is a block diagram illustrating a schematic configuration example of a digital PLL circuit to which the digitally controlled oscillator circuit of FIG. 1 is applied, in the digitally controlled oscillator device according to the first embodiment of the present invention.

FIG. 13 is a block diagram showing a schematic configuration example of a digitally PLL circuit to which the digitally controlled oscillator circuit shown in FIG. 1 is applied, in the digitally controlled oscillator device according to the first embodiment of the present invention. The digitally PLL circuit (digitally controlled oscillator device) DPLL shown in FIG. 13 is equipped with a time difference detector (digital phase comparator) TDC, a digital low-pass filter (digital loop filter) DLPF, a digitally controlled oscillator circuit DCO, a multi modulus frequency divider (division section) MMD, and a sigma delta modulator (or delta sigma modulator) SDM. The configuration example of FIG. 1 or the like is applied to the digitally controlled oscillator circuit DCO.

The time difference detector TDC detects a difference in phase (time) between a reference oscillation signal REF having a reference oscillation frequency (e.g., 26 MHz) generated by a crystal oscillator or the like, and a division oscillation signal FDIV generated by the multi modulus frequency divider (division section) MMD. The time difference detector TDC includes, for example, plurality of stages of unit delay circuits (CMOS inverter circuits). The time difference detector TDC sequentially delays the division oscillation signal FDIV by means of the unit delay circuits, latches outputs of the unit delay circuits in sync with the reference oscillation signal REF, and detects a phase difference (time difference) according to the result of the latch. The smaller the amount of delay in each unit delay circuit with miniaturization through a CMOS manufacturing process, the more the detected result of phase difference (time difference) can be improved in accuracy.

The digital low-pass filter DLPF performs an averaging process with a digital code CODE1 indicative of the result of phase comparison from the time difference detector TDC as a target. As the digital low-pass filter DLPF, may be mentioned, typically, an IIR (Infinite Impulse Response) filter, an FIR (Finite Impulse Response) filter, a combination of these or the like. In response to a digital code indicative of the result of processing by the digital low-pass filter DLPF, the digitally controlled oscillator circuit DCO generates an oscillation output signal PLLOUT having an oscillation frequency corresponding to the value of the digital code. The digital code corresponds to the integer capacitance value control signal W_INT or the fractional capacitance value control signal W_FRAC in FIG. 1. Incidentally, although not shown in the drawing, a frequency difference detector or the like provided with a counter circuit or the like is actually provided along with the time difference detector TDC. The automatic band control signal W_ABS shown in FIG. 1 is generated by the frequency difference detector or the like.

The sigma delta modulator SDM sets a division ratio to the multi modulus frequency divider MMD based on a division ratio set code DAT-DIVN and variably controls the division ratio. For example, the division ratio set code DAT-DIVN indicates a division ratio including a decimal fraction. The sigma delta modulator SDM sets integer division ratios different on a time sequence basis to the multi modulus frequency divider MMD to thereby set a division ratio including a decimal fraction on average. The multi modulus frequency divider MMD divides the oscillation output signal PLLOUT with the division ratio set by the sigma delta modulator SDM and feeds back the result of division to the time difference detector TDC as the division oscillation signal FDIV.

At such a configuration and operation, the digitally controlled oscillator circuit DCO is capable of reflecting the phase difference (time difference) detected by the time difference detector TDC on the oscillation frequency of the oscillation output signal PLLOUT through the fractional capacitance value control signal W_FRAC with a high degree of accuracy by using the above capacitor bank CFRAC for the fractional value. As a result, a high-accurate oscillation output signal small in phase error can be obtained. Since the sigma delta modulator for realizing the fractional capacitance is not used at this time the sigma delta modulator SDDCO for the DCO in the digitally controlled oscillator device DPLLc of FIG. 20 becomes unnecessary), noise away from the oscillation frequency can be reduced.

Figure 14:
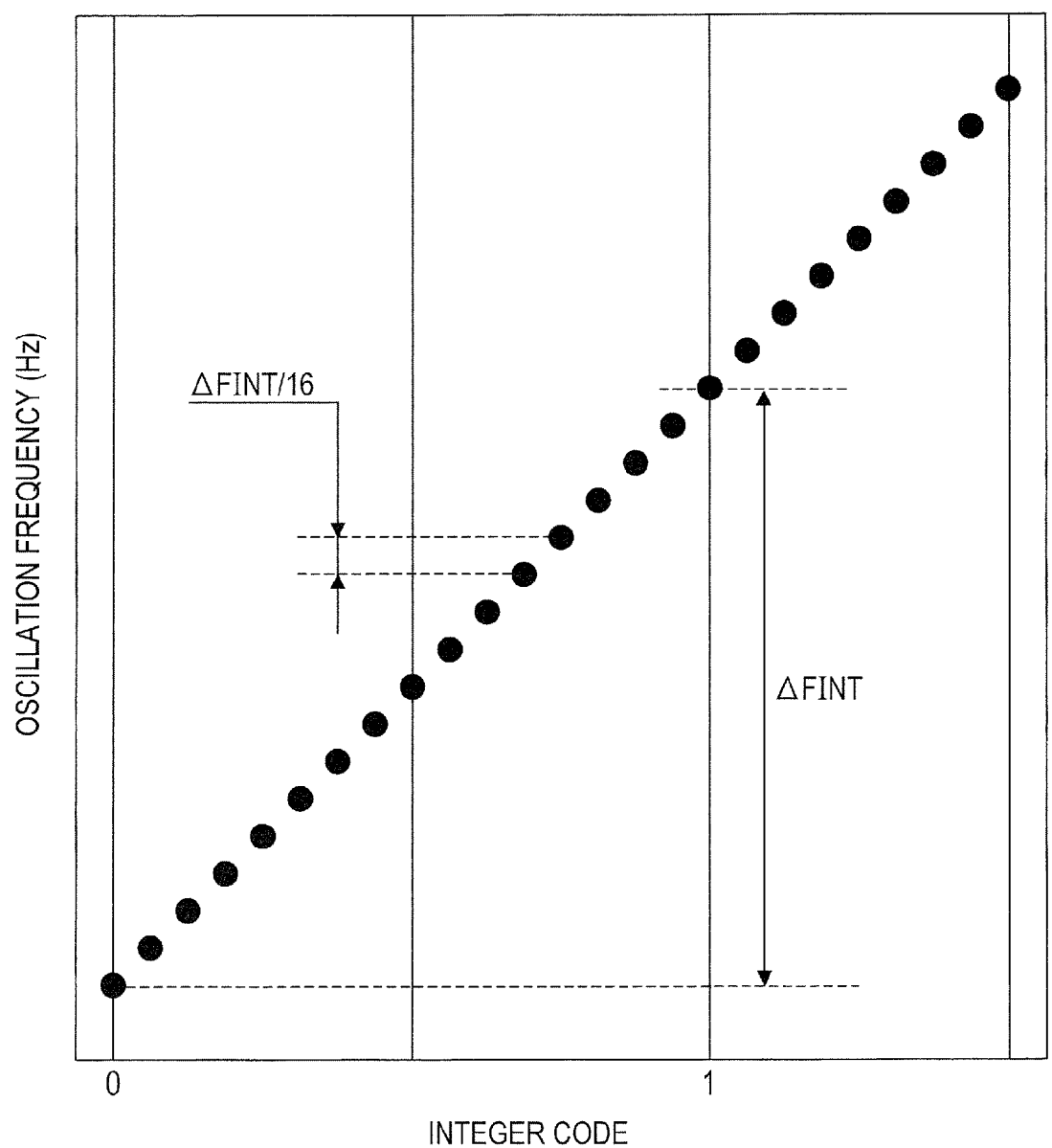
FIG. 14 is a conceptual diagram showing operation examples of FIGS. 6 and 13.

FIG. 14 is a conceptual diagram showing operation examples of FIGS. 6 and 13. In FIG. 14, the horizontal axis indicates an integer code, and the vertical axis indicates an oscillation frequency. The amount of change in integer code "1" corresponds to one bit of the integer capacitance value control signal W_INT in FIG. 13. As shown in FIG. 14, such a fractional-value capacitor bank CFRAC as shown in FIG. 6 is applied to the digitally controlled oscillator circuit DCO in the digitally controlled oscillator device DPLL of FIG. 13 to thereby make it possible to control the oscillation frequency in a state in which an amount of change ΔFINT in oscillation frequency corresponding to the amount of change in integer code "1" is further divided into 1.6 parts (ΔFINT/16). Since the faction capacitance based on the capacitor bank CFRAC can highly accurately be realized as mentioned above at this time, an improvement in DNL (i.e., the degree of linearity of tilt characteristics in FIG. 14) and the like can be achieved.

<<Verification Result of Digital PLL Circuit>>

Figure 15:
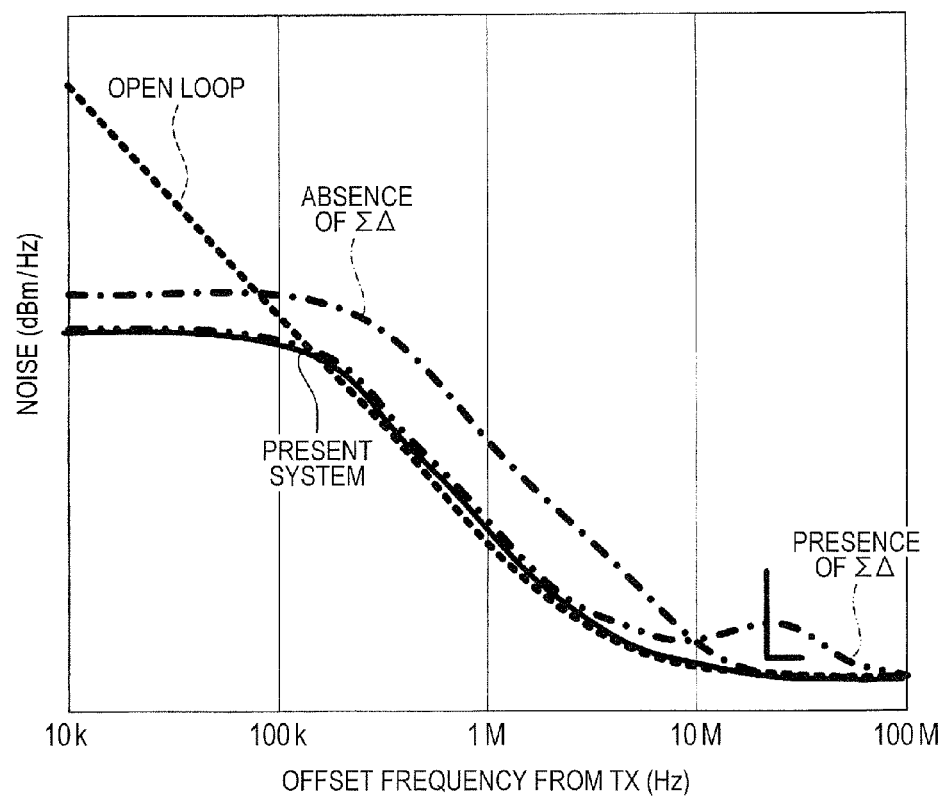
FIG. 15 is a diagram illustrating one example of a result of verification of noise characteristics, which has been performed as targeted for the digital PLL circuit of FIG. 13.
Figure 20:
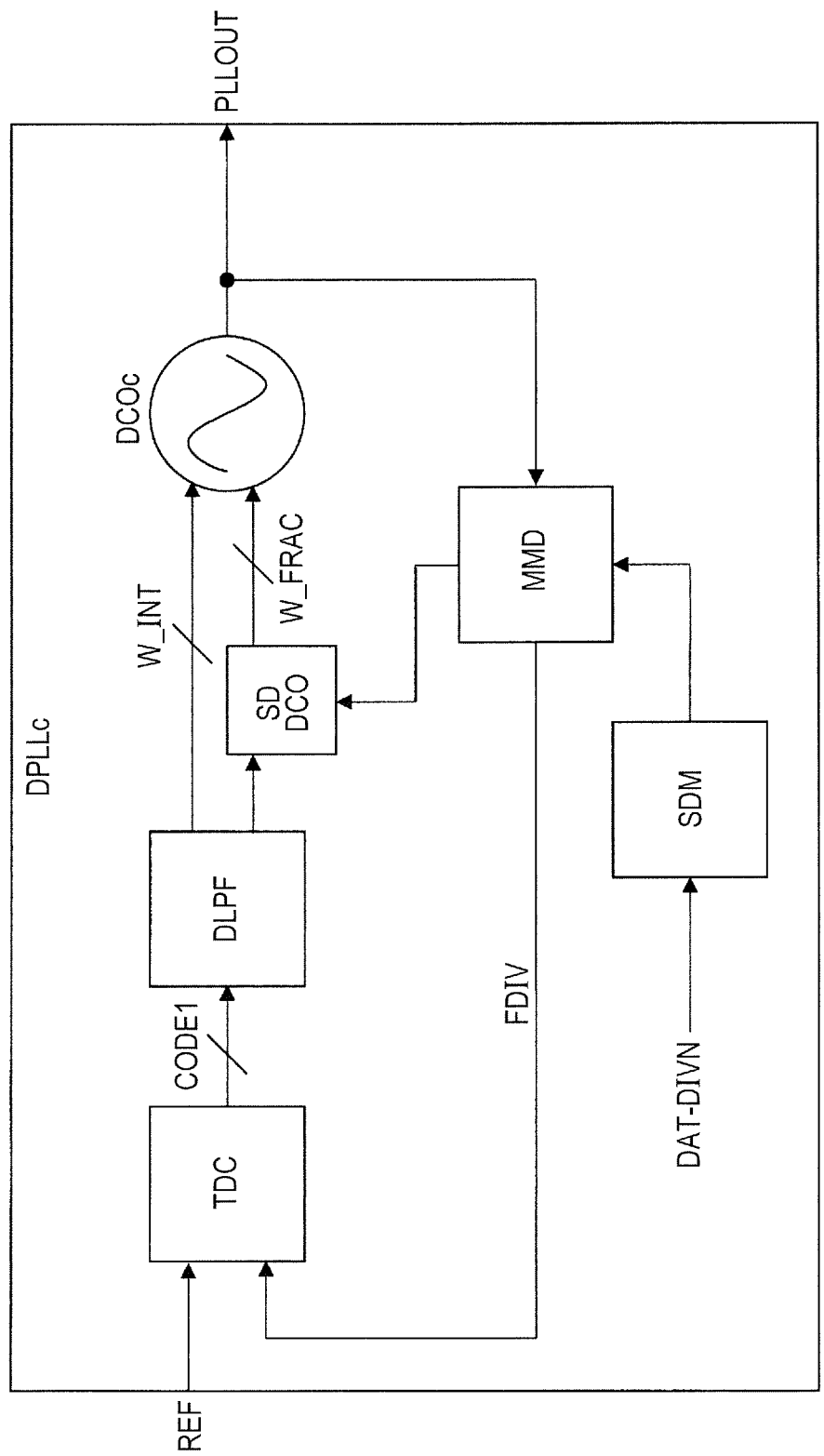
FIG. 20 is a block diagram showing a schematic configuration example of a digitally controlled oscillator device discussed as a premise of the present invention.

FIG. 15 is a diagram illustrating one example of a result of verification of noise characteristics, which has been performed as targeted for the digital PLL circuit of FIG. 13. In FIG. 15, the horizontal axis indicates an offset frequency (Hz) with a predetermined oscillation frequency as a reference, and the vertical axis indicates noise (dBm/Hz). There are shown herein where the digital PLL circuit is set to an open loop in conjunction with the case where the digital PLL circuit of FIG. 13 is used (present system), where the sigma delta modulator for the DCO is not used without using the present system (the absence of ΣΔ), and where the sigma delta modulator for the DCO is used as shown in FIG. 20 (the presence of ΣΔ).

As shown in FIG. 15, in the case where the sigma delta modulator for the DCO is not used. (absence of ΣΔ), noise close to the oscillation frequency is deteriorated due to quantization noise as compared with at the open loop. On the other hand, when the sigma delta modulator for the DCO is used (presence of ΣΔ), the proximal noise is improved but noise away from the oscillation frequency is deteriorated. On the other hand, when the present system is used, noise close to the oscillation frequency is improved due to an increase in accuracy of the fractional capacitance (i.e., a reduction in quantization noise), and noise away from the oscillation-frequency is also improved by the nonuse of the sigma delta modulator.

Using the digitally controlled oscillator device according to the first embodiment as described above makes it possible to typically reduce noise away from the oscillation frequency. Additionally, noise close to the oscillation frequency can be reduced.

Second Embodiment

<<Various Schematic Configurations of High Frequency Signal Processing Device>>

The second embodiment will explain various configuration examples of a high frequency signal processing device for various wireless communication systems (typically cellular phones) each equipped with such a digitally controlled oscillator device as described in the first embodiment.

Figure 16:
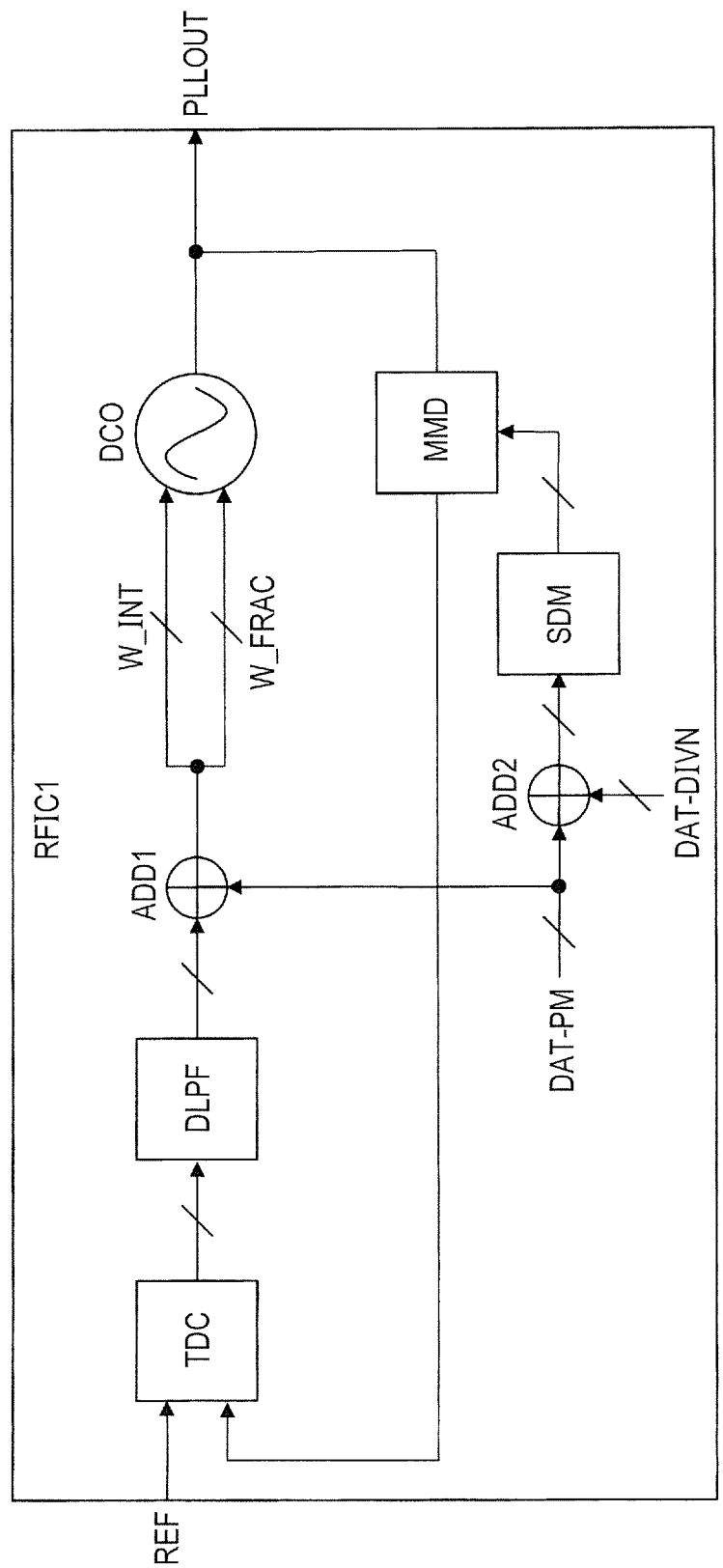
FIG. 16 is a block diagram showing a schematic configuration example of a high frequency signal processing device according to a second embodiment of the present invention.

FIG. 16 is a block diagram illustrating a schematic configuration example of a high frequency signal processing device according to the second embodiment of the present invention. The high frequency signal processing device RFIC1 shown in FIG. 16 is configured by one semiconductor chip, for example. The high frequency signal processing device RFIC1 is equipped with a time difference detector TDC, a digital low-pass filter DLPF, a digitally controlled oscillator circuit DCO, a multi modulus frequency divider MMD, a sigma delta modulator SDM, and synthetic or additive circuits ADD1 and ADD2. Here, such a configuration example as described in the first embodiment is applied to the digitally controlled oscillator circuit DCO. Each circuit in the high frequency signal processing device RFIC1 configures, for example, a part of a transmission circuit in the wireless communication system.

The high frequency signal processing device RFIC1 of FIG. 16 takes a configuration in which the synthetic circuits ADD1 and ADD2 are added to the digital PLL circuit DPLL described in FIG. 13. A detailed description of parts that overlap with those in FIG. 7 is omitted subsequently. The synthetic circuit ADD1 synthesizes the output of the digital low-pass filter DLPF and a phase modulation code DAT-PM, and outputs the result of synthesis to the digitally controlled oscillator circuit DCO as a digital code. The digital code corresponds to a fractional capacitance value control signal W_INT and a fractional capacitance value control signal W_FRAC. The synthetic circuit ADD2 synthesizes the phase modulation code DAT-PM and a division ratio set code DAT-DIVN and inputs the result of synthesis to the sigma delta modulator SDM. As a result, an oscillation output signal PLLOUT added with the phase modulation corresponding to the phase modulation code DAT-PM with a predetermined oscillation frequency as a reference is generated from the digitally controlled oscillator circuit DCO. The oscillation output signal PLLOUT is amplified by, for example, an unillustrated power amplifier device or the like, followed by being transmitted via an antenna.

Thus, a scheme in which phase modulation associated with the phase modulation code DAT-PM is directly performed on the digitally controlled oscillator circuit DCO through the synthetic circuit ADD1, and phase modulation associated with the phase modulation code DAT-PM is performed on the multi modulus frequency divider MMD (sigma delta modulator SDM) through the synthetic circuit ADD2 is called a two point modulation scheme. If only the modulation path to the multi modulus frequency divider MMD (sigma delta modulator SDM) is taken, the corresponding path assumes a low-pass filter characteristic, and its loop band is limited to, for example, a few hundred kHz or so in terms of out-of-band noise and spurious. Therefore, high-frequency transmission data is in danger of missing (i.e., the speed-up of a transmission data rate becomes difficult). On the other hand, if only the modulation path to the digitally controlled oscillator circuit DCO is taken, the corresponding path is brought to a high-pass filter characteristic. Therefore, a low-frequency frequency component is not sufficiently obtained, and a state close to open loop control is reached because of loop out-of-band control, thus causing a fear that the accuracy of modulation is degraded. Thus, if the two point modulation scheme is used, the low-pass filter characteristic and the high-pass filter characteristic are made to complement each other, so that communications in a wide band can be achieved.

If the high frequency signal processing device RFIC1 of FIG. 16 is used, a high-accuracy and high-quality oscillation output signal PLLOUT can be generated because the noise away and close to the oscillation frequency can be reduced by the digitally controlled oscillator circuit DCO according to the present embodiment, in addition to the advantageous effect by the above two point modulation scheme. As a result, a high frequency signal reduced in spectrum degradation and having a high modulation accuracy (high EVM (Error Vector Magnitude) characteristic) can be transmitted through the unillustrated antenna. Sine the sigma delta modulator for the DCO becomes unnecessary, a reduction in power consumption and the like can be achieved. Incidentally, although not limited in particular, the high frequency signal processing device RFIC1 can be applied to, for example, a cellular phone system based on a GSM (Global System for Mobile Communications) standard system, in which GMSK (Gaussian filtered Minimum Shift Keying) modulation is used, a ZigBee (registered trademark) system in which OQPSK (offset quadrature phase shift keying) modulation is used, etc.

Figure 17:
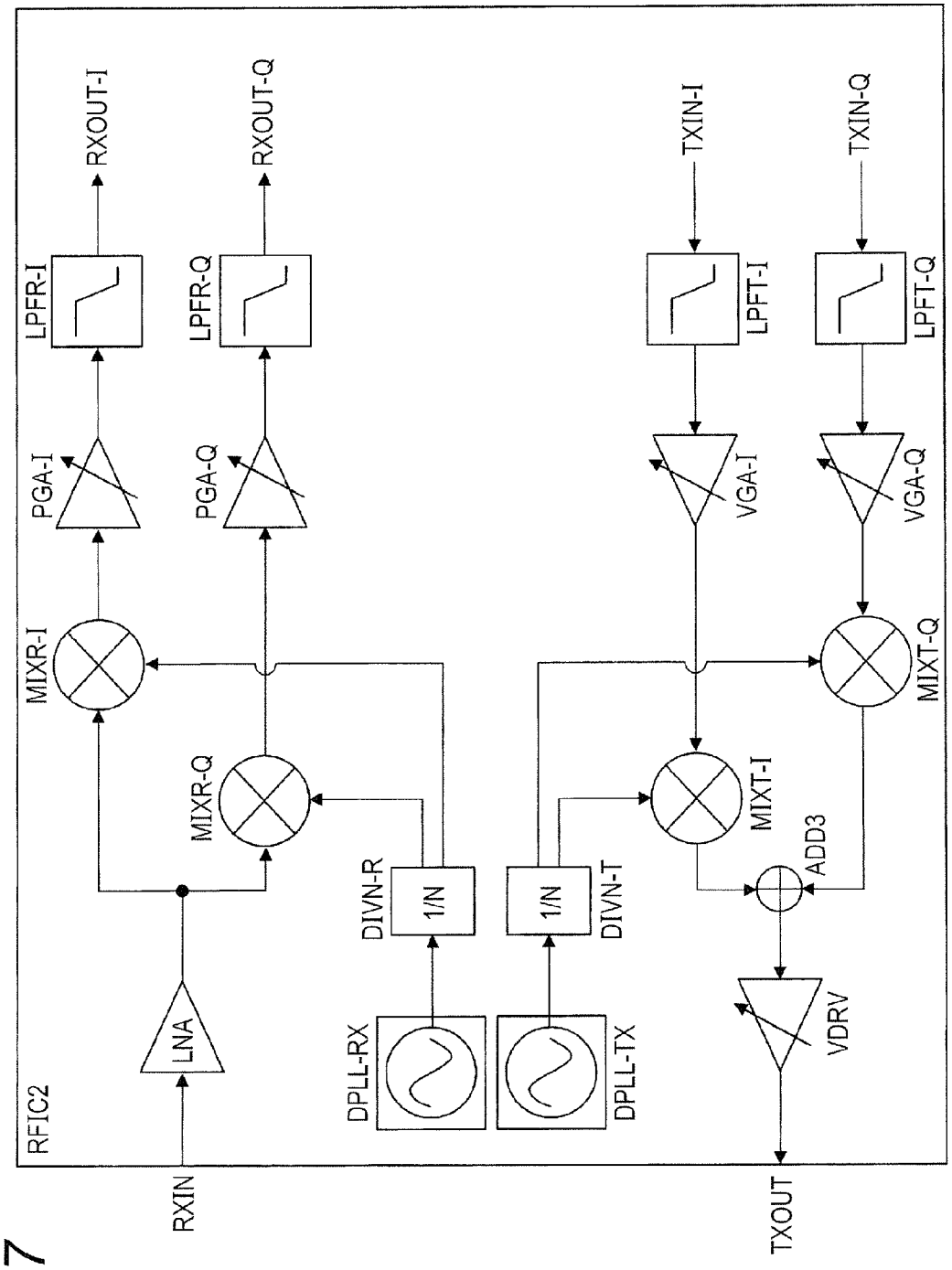
FIG. 17 is another block diagram showing a schematic configuration example of the high frequency signal processing device according to the second embodiment of the present invention.

FIG. 17 is another block diagram showing a schematic configuration example of the high frequency signal processing device according to the second embodiment of the present invention. The high frequency signal processing device RFIC2 shown in FIG. 17 is configured by, for example, one semiconductor chip. The high frequency signal processing device RFIC2 includes, as a transmission circuit, low-pass filters LPFT-I and LPFT-Q, variable amplifiers VGA-1 and VGA-Q, transmission mixers MIXT-I and MIXT-Q, a synthetic circuit ADD3, a variable driver VDRV, a transmission digital PLL circuit DPLL_TX, and a divider DIVN-T. The high frequency signal processing device RFIC2 includes, as a reception circuit, a low noise amplifier LNA, reception mixers and MIXR-Q, programmable gain circuits PGA-I and PGA-Q, pass filters LPFR-I and LPFR-Q, a reception digital PLL circuits DPLL_RX, and a divider DIVN-R. Here, such a configuration example as described in FIG. 13 showing the first embodiment is applied to the transmission digital PLL circuit DPLL_TX and the reception digital PLL circuit DPLL_RX. Such a configuration example as described in the first embodiment is applied to the digitally controlled oscillator circuit DCO shown within FIG. 3.

In FIG. 17, transmission baseband signals TXIN-I and TXIN-Q that assume orthogonal signals are transmitted through the low-pass filters LPFT-I and LPFT-Q during a transmission operation and appropriately amplified by the variable amplifiers VGA-I and VGA-Q, followed by being input to the transmission mixers MIXT-I and MIXT-Q. The transmission mixers MIXT-I and MIXT-Q upconvert (frequency-convert) the transmission baseband signals outputted via the variable amplifiers VGA-I and VGA-Q to predetermined high frequency signals, using local signals (carrier signal and local oscillation signal) outputted from the divider DIVN-T. At this time, the divider DIVN-T suitably divides an oscillation output signal outputted from the transmission digital PLL circuit DPLL_TX and besides generates two local signals different 90° in phase. The divider DIVN-T outputs one of them to the transmission mixer MIXT-I and outputs the other thereof to the transmission mixer MIXT-Q. The synthetic circuit ADD3 performs vector synthesis of the output of the transmission mixer MIXT-I and the output of the transmission mixer MIXT-Q. The variable driver VDRV amplifies the vector-synthesized high frequency signal with prescribed gain and thereby generates a transmission high frequency signal TXOUT. The high frequency signal TXOUT is amplified by an unillustrated power amplifier device or the like and thereafter transmitted through the antenna.

In FIG. 17, during a reception operation, a reception high frequency signal RXIN received by the unillustrated antenna is inputted to the low-noise amplifier LNA. The high frequency signal amplified by the low-noise amplifier LNA is inputted to the reception mixers MIXR-I and MIXR-Q. The reception mixers MIXR-I and MIXR-Q downconvert (frequency-convert) the high frequency signal outputted from the low-noise amplifier LNA into predetermined baseband signals, using local signals (carrier signal and local oscillation signal) outputted from the divider DIVN-R. At this time, the divider DIVN-R suitably divides an oscillation output signal outputted from the reception digital PLL circuit DPLL_RX and besides generates two local signals different 90° in phase. The divider DIVN-R outputs one of them to the reception mixer MIXR-I and outputs the other thereof to the reception mixer MIXR-Q. The signals outputted from the reception mixers MIXR-I and MIXR-Q are appropriately amplified by the programmable gain circuits PGA-I and PGA-Q, followed by being outputted via the low-pass filters LPFR-I and LPFR-Q. The output signals become reception baseband signals RXOUT-I and RXOUT-Q corresponding to orthogonal signals.

Using the high frequency signal processing device RFIC2 of FIG. 17 enables the generation of the high-accuracy or high-quality local signals with the transmission digital PLL circuit DPLL_TX during the transmission operation, for example, thereby making it possible to achieve a reduction in the phase error at the transmission high frequency signal, an improvement in spectrum and so on. Since the local signals small in phase noise can be generated with the reception digital PLL circuit DPLL_RX during the reception operation, reduction in BER (Bit Error Rate) and the like can be achieved. Since the various phase modulation or amplitude modulation in addition to it can be realized, the high frequency signal processing device RFIC2 can be applied to various cellular phone systems like so-called 2G (e.g., GSM standard), 3G (e.g., W-CDMA (Wideband Code Division Multiple Access) standard) and 3.9G (e.g., LTE (Long Term Evolution) standard).

Since an FDD system is used in 3G or 3.9G or the like, for example, TXOUT having a predetermined transmission frequency band needs to avoid affecting RXIN having a predetermined reception frequency band. If the sigma delta modulator for the DCO is applied to the transmission digital PLL circuit DPLL_TX as described above, noise away from the oscillation frequency occurs in TXOUT and is in danger of affecting the reception frequency band (causing overlapping, for example). There is therefore a case where a SAW filter or the like for suppressing it is needed before TXOUT. On the other hand, since such noise is reduced when the transmission digital PLL circuit DPLL_TX of the present embodiment is used, the SAW filter or the like becomes unnecessary, thus making it possible to achieve miniaturization of a wireless communication system, a reduction in its cost and so on. Incidentally, the high frequency signal processing device RFIC2 can of course be applied not only to cellular phone systems, but also to various wireless communication systems such as a wireless LAN (Local Area Network), Bluetooth (registered trademark), and a ZigBee (registered trademark) system.

Figure 18:
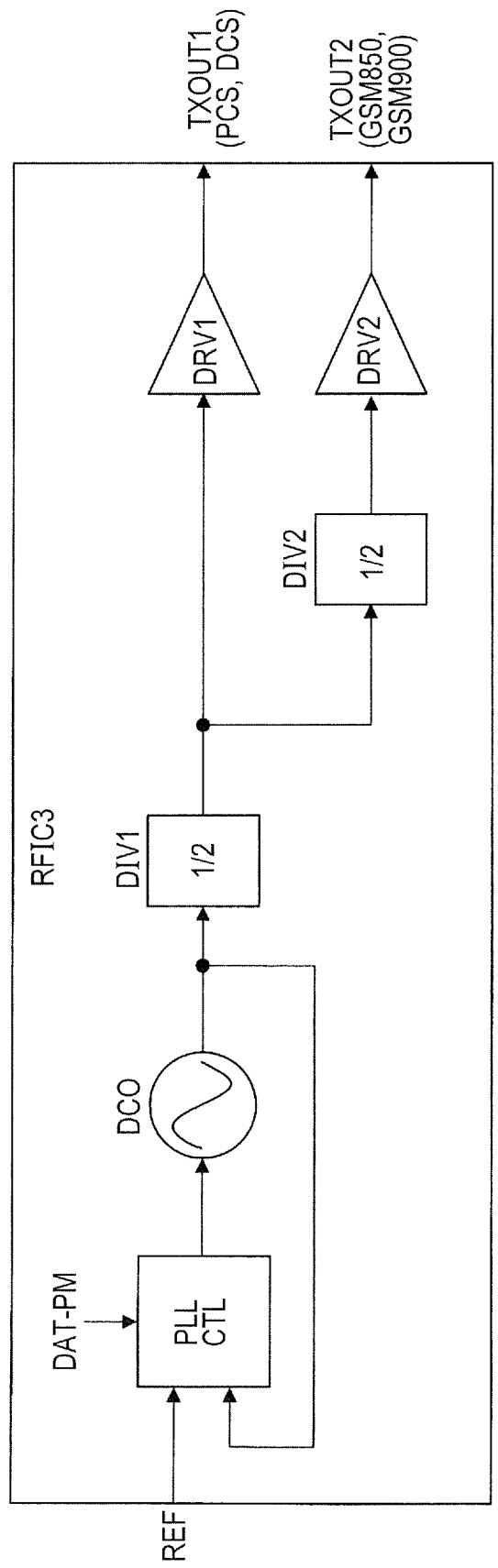
FIG. 18 is a further block diagram showing a schematic configuration example of the high frequency signal processing device according to the second embodiment of the present invention.

FIG. 18 is a further block diagram showing a schematic configuration example of the high frequency signal processing device according to the second embodiment of the present invention. The high frequency signal processing device RFIC3 shown in FIG. 18 is configured by one semiconductor chip, for example. The high frequency signal processing device RFIC3 is equipped with a PLL controller PLLCTL, a digitally controlled oscillator circuit DCO, dividers DIV1 and DIV2, and drivers DRV1 and DRV2. Here, such a configuration example as described in the first embodiment is applied to the digitally controlled oscillator circuit DCO. Each circuit in the high frequency signal processing device RFIC3 configures a part of a transmission circuit in a wireless communication system, for example.

The PLL controller PLLCTL includes, for example, a phase comparator, a loop filter circuit, a divider and so on. The PLL controller PLLCTL generates a division signal having a predetermined division ratio in response to an oscillation output signal sent from the digitally controlled oscillator circuit DCO and controls the oscillation frequency of the digitally controlled oscillator circuit DCO in such a manner that the phase of the division signal and the phase of a reference oscillation signal REF coincide with each other. The PLL controller PLLCTL inputs a phase modulation code DAT-PM therein and performs modulation, based on the phase modulation code DAT-PM. Specifically, the PLL controller PLLCTL performs direct modulation on the digitally controlled oscillator circuit DCO or performs such two-point modulation as described in FIG. 16. It is known that MSK (Minimum Shift Keying) modulation is enabled by performing FSK (frequency shift keying) in which a modulation index is 0.5, for example. This is combined with a Gaussian filter to thereby enable GMSK modulation used in the GSM standard or the like.

The divider DIV1 ½-divides the oscillation output signal of such a digitally controlled oscillator circuit DCO, for example. The driver DRV1 outputs a transmission high frequency signal TXOUT1 in response to the output of the divider DIV1. The transmission high frequency signal TXOUT1 is amplified by an unillustrated power amplifier device or the like, followed by being transmitted via the corresponding antenna. The transmission high frequency signal TXOUT1 is, for example, a signal based on a PCS (Personal Communication Service) standard having a transmission frequency band ranging from 1850 MHz to 1910 MHz and a reception frequency band ranging from 1930 MHz to 1990 MHz, or a DCS (Digital Cellular System) standard having a transmission frequency band ranging from 1710 MHz to 1785 MHz and a reception frequency band ranging from 1805 MHz to 1880 MHz. Incidentally, each of the PCS standard and the DCS standard is also called a high band based on the GSM standard, or the like.

The divider DIV2 further performs, for example, a ½-division on the output signal of the divider DIV1. The driver DRV2 outputs a transmission high frequency signal TXOUT2 in response to the output of the divider DIV2. The transmission high frequency signal TXOUT2 is amplified by an unillustrated power amplifier device or the like, followed by being transmitted via the corresponding antenna. The transmission high frequency signal TXOUT2 is, for example, a signal based on a GSM850 standard having a transmission frequency band ranging from 824 MHz to 849 MHz and a reception frequency band ranging from 869 MHz to 894 MHz, or a GSM900 standard having a transmission frequency band ranging from 880 MHz to 915 MHz and a reception frequency band ranging from 925 MHz to 960 MHz. Incidentally, either one of the drivers DRV1 and DRV2 is activated according to the setting of a communication mode. When the high frequency signal processing device RFIC3 of FIG. 18 is used, a high-accuracy or high-quality oscillation output signal can be generated based on the digitally controlled oscillator circuit DCO according to the present embodiment. As a result, a high frequency signal low in spectrum degradation and having a high modulation accuracy (high EVM characteristic) can be transmitted through the unillustrated antenna.

Figure 19:
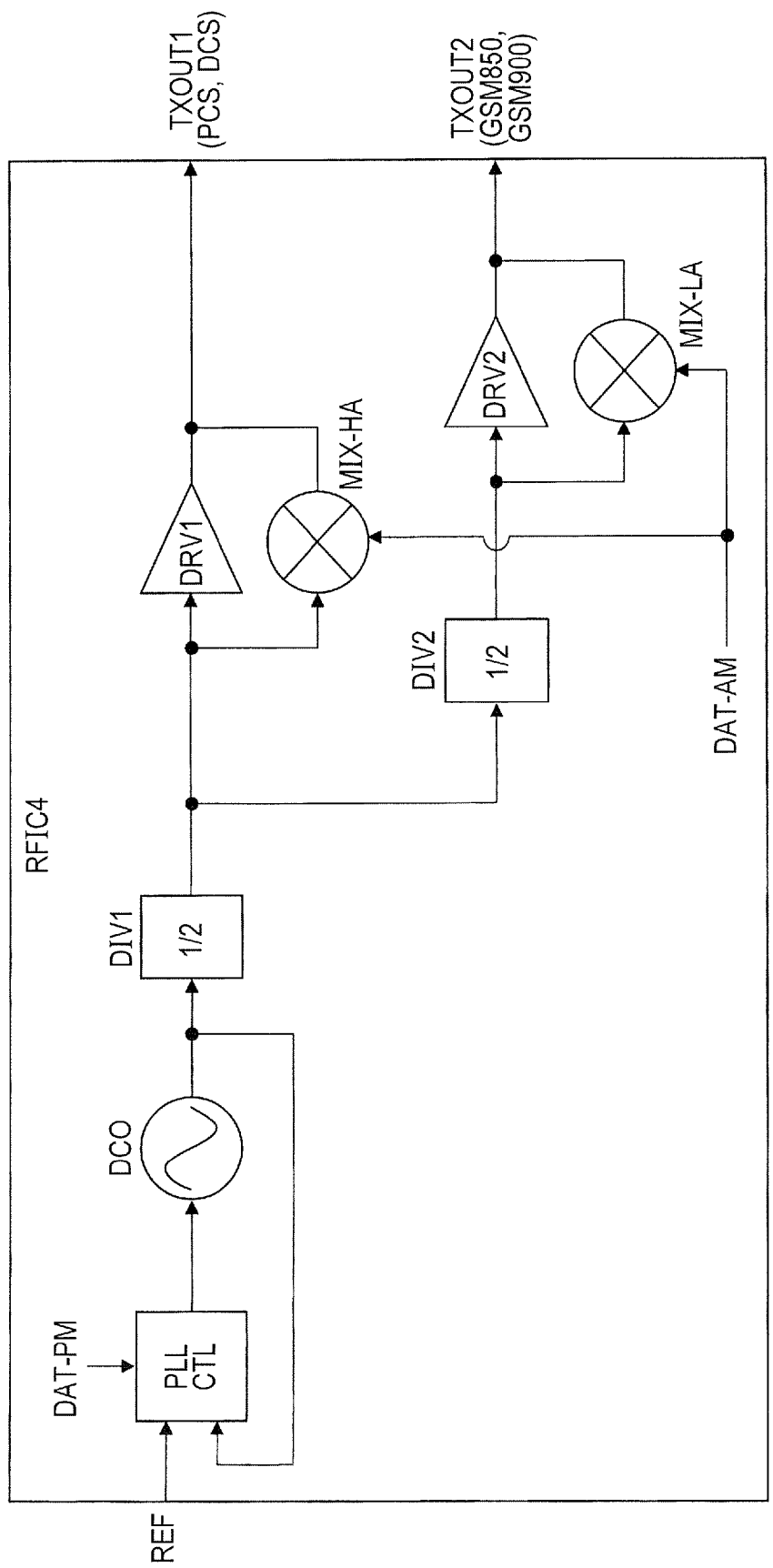
FIG. 19 is a yet another block diagram showing a schematic configuration example of the high frequency signal processing device according to the second embodiment of the present invention.

FIG. 19 is a yet another block diagram showing a schematic configuration example of the high frequency signal processing device according to the second embodiment of the present invention. The high frequency signal processing device RFIC4 shown in FIG. 19 is configured by one semiconductor, chip, for example. The high frequency signal processing device RFIC4 takes a configuration in which two amplitude modulation mixers MIX-HA and MIX-LA are added to the high frequency signal processing device RFIC3 of FIG. 18. The high frequency signal processing device RFIC4 is similar to that of FIG. 18 in configuration other than it, and its detailed description will therefore be omitted. The amplitude modulation mixer MIX-HA is provided in parallel with the input/output of the driver DRV1. The amplitude modulation mixer MIX-HA amplitude-modulates the output of the divider DIV1 with an amplitude modulation code DAT-AM and outputs the result of amplitude-modulation as TXOUT1. Likewise, the amplitude modulation mixer MIX-LA is provided in parallel with the input/output of the driver DRV2. The amplitude modulator mixer MIX-LA amplitude-modulates the output of the divider DIV2 with the amplitude modulation code DAT-AM and outputs the result of amplitude-modulation as TXOUT2.

Any one of the driver DRV1, the amplitude modulation mixer MIX-HA, the driver DRV2 and the amplitude modulation mixer MIX-LA is activated. When the driver DRV1 is activated, the signal based on such a PCS or DCS standard as described above is outputted as TXOUT1. When the driver DRV2 is activated, the signal based on such a GSM850 or GSM900 standard as described above is outputted as TXOUT2. On the other hand, when the amplitude modulation mixer MIX-HA is activated, a signal of an EDGE (Enhanced Data rates for GSM Evolutions) mode based on the PCS standard or the DCS standard is outputted as TXOUT1. When the amplitude modulation mixer MIX-LA is activated, a signal of an EDGE mode based on the GSM850 or GSM900 standard is outputted as TXOUT2. Since 8PSK (Phase Shift Keying) modulation or the like which causes a comprehensive-line fluctuation unlike GMSK modulation which causes no comprehensive-line fluctuation is used in the EDGE mode, amplitude control by each of the amplitude modulation mixers MIX-HA and MIX-LA is needed.

Using the high frequency signal processing device according to the second embodiment as described above makes it possible to achieve improvements in modulation accuracy and demodulation accuracy in addition to the accuracy of setting of the oscillation frequency. Typically, the quality of transmission and reception signals can therefore be improved. Further, since noise away from the oscillation frequency can be reduced, interference of the transmission and reception signals and the like can be suppressed in the FDD system, for example. Even at a TDD system, for example, such a situation that a given transmission channel affects another transmission channel can be suppressed. As a result, the SAW filter or the like in the transmission circuit becomes unnecessary, thus making it possible to achieve miniaturization of a wireless communication system and a reduction in its cost.

Although the invention includes above by the present inventors has been described specifically on the basis of the preferred embodiments, the present invention is not limited to the embodiments referred to above, but can be modified in various ways within the scope not departing from the gist thereof. For example, although the digitally controlled oscillator circuit according to the present embodiment has been applied to the wireless communication system herein, the digitally controlled oscillator circuit can also be applied to a wire communication system as the case may be.

What is claimed is:

1. A digitally controlled oscillator device comprising:
   first and second oscillation output nodes from which complementary oscillation output signals are output;
   coil elements coupled between the first oscillation output node and the second oscillation output node;
   capacitors units respectively having the same circuit configuration and substantially the same layout configuration, said each capacitor unit having a first capacitive element, a first switch and a second capacitive element coupled in series in order between first and second nodes; and
   a negative resistance generating circuit which generates a negative resistance between the first oscillation output node and the second oscillation output node,
   wherein a part of the capacitor units configures a first capacitor bank as first capacitor units;
   wherein another part of the capacitor units configure a second capacitor bank;
   wherein the first node of each of the first capacitor units is coupled to the first oscillation output node, and the second node of each thereof is coupled to the second oscillation output node, respectively;
   wherein the second capacitor bank includes capacitor blocks comprising N (where N: integer greater than or equal to 2) capacitor units, said each capacitor block including a second capacitor unit being one of the N capacitor units, and (N−1) third capacitor units being other than the second capacitor unit;
   wherein the first node of the second capacitor unit is coupled to the first oscillation output node, and the second node thereof is coupled to the second oscillation output node, respectively;
   wherein the first and second nodes of the (N−1) third capacitor units are coupled to an AC ground power supply voltage;
   wherein a node on the first switch side, of the first capacitive element in the second capacitor unit is coupled in common to a node on the first switch side, of the first capacitive element in each of the (N−1) third capacitor units;
   wherein a node on the first switch side, of the second capacitive element in the second capacitor unit is coupled in common to a node on the first switch side, of the second capacitive element in each of the (N−1) third capacitor units, and
   wherein the first switches in the second capacitor unit and the (N−1) third capacitor units are controlled in common in on/off operations.

2. The digitally controlled oscillator device according to claim 1, wherein each of the capacitor units further includes a second switch coupled between the node on the first switch side, of the first capacitive element and the AC ground power supply voltage and controlled in on/off operation in common with the first switch, and a third switch coupled between the node on the first switch side, of the second capacitive element and the AC ground power supply voltage and controlled in on/off operation in common with the first switch.

3. The digitally controlled oscillator device according to claim 2,
   wherein the second capacitor bank further includes the capacitor blocks;
   wherein a first capacitor block corresponding to any one of the capacitor blocks has a configuration in which the value of the "N" is $2^M$ (where M: integer greater than or equal to 1), and
   wherein a second capacitor block corresponding to any another one of the capacitor blocks has a configuration in which the value of the "N" is $2^J$ (where J is an integer greater than or equal to 1 and a value different from the M).

4. The digitally controlled oscillator device according to claim 3, further including a division circuit which divides each of the complementary oscillation output signals and thereby outputs a division oscillation signal;
   a phase difference detection circuit which compares the phase of a reference oscillation signal input in advance and the phase of the division oscillation signal and outputs the result of comparison as a first digital code;
   a digital filter which performs an averaging process with the first digital code as a target and outputs a second digital code, and
   a sigma delta modulation circuit which sets a division ratio to the division circuit and changes the division ratio on a time-series basis,
   wherein each of the first switches in the first capacitor units is controlled based on the second digital code;
   wherein the first switches in the second capacitor unit and the (N−1) third capacitor units in the first capacitor block are respectively controlled in common based on the second digital code, and
   wherein the first switches in the second capacitor unit and the (N−1) third capacitor units in the second capacitor block are respectively controlled in common based on the second digital code.

5. A digitally controlled oscillator device comprising:
   a coil metal wiring which is formed substantially in a ring form and disposed symmetrically with respect to a first axis and has a middle point grounded on an AC basis, thereby realizing a first coil element on one side and a second coil element on the other side on the basis of the middle point;

a first oscillation output node metal wiring which branches off from the first coil element side of the coil metal wiring and extends along a second axis orthogonal to the first axis;

a second oscillation output node metal wiring which branches off from the second coil element side of the coil metal wiring and extends along the second axis, a capacitor bank including capacitor units which are formed within a ring of the coil metal wiring having shape substantially equivalent to the ring form and disposed in a matrix form, and a negative resistance generating circuit which is formed within the ring of the coil metal wiring and generates a negative resistance between the first oscillation output node metal wiring and the second oscillation output node metal wiring;

wherein each of the capacitor units has the same circuit configuration and substantially the same layout configuration and includes a first capacitive element, first switch and a second capacitive element coupled in series in order between first and second nodes;

wherein the capacitor bank comprises first capacitor units being a part of the capacitor units and includes a first capacitor bank in which the first nodes of the first capacitor units are coupled to the first oscillation output node metal wiring, and the second nodes thereof are coupled to the second oscillation output node metal wiring, respectively, and a second capacitor bank comprising another part of the capacitor units and including a capacitor block comprising N (where N: integer greater than or equal to 2) capacitor units;

wherein the capacitor block includes a second capacitor unit being one of the N capacitor units, and (N−1) third capacitor units being other than the second capacitor unit;

wherein the first node of the second capacitor unit is coupled to the first oscillation output node meal wiring, and the second node thereof is coupled to the second oscillation output node metal wiring, respectively;

wherein the first and second nodes of the (N−1) third capacitor units are coupled to an AC ground power supply voltage;

wherein a node over the first switch side, of the first capacitive element in the second capacitor unit is coupled in common to a node on the first switch side, of the first capacitive element in each of the (N−1) third capacitor units, using a first metal wiring;

wherein a node over the first switch side, of the second capacitive element in the second capacitor unit is coupled in common to a node over the first switch side, of the second capacitive element in each of the (N−1) third capacitor units, using a second metal wiring, and wherein the first switches in the second capacitor unit and the (N−1) third capacitor units are controlled in common in on/off operations.

6. The digitally controlled oscillator device according to claim 5, wherein the capacitor block comprise N capacitor units continuous in a column or row direction, of the capacitor units disposed in the matrix form.

7. The digitally controlled oscillator device according to claim 6, wherein an electrode over the first switch side, of the first capacitive element in the first capacitor unit has a shape on which the shape of the first metal wiring is reflected, and wherein an electrode over the first switch side, of the second capacitive element in the first capacitor unit has a shape on which the shape of the second metal wiring is reflected.

8. The digitally controlled oscillator device according to claim 7, wherein each of the capacitor units further includes a second switch coupled between the node over the first switch side, of the first capacitive element and the AC ground power supply voltage and controlled in on/off operation in common with the first switch, and a third switch coupled between the node over the first switch side, of the second capacitive element and the AC ground power supply voltage and controlled in on/off operation in common with the first switch.

9. The digitally controlled oscillator device according to claim 5, wherein the second capacitor bank further includes the capacitor blocks, wherein a first capacitor block corresponding to any one of the capacitor blocks has a configuration in which the value of the "N" is $2^M$ (where M: integer greater than or equal to 1), and wherein a second capacitor block corresponding to any another one of the capacitor blocks has a configuration in which the value of the "N" is $2^J$ (where J is an integer greater than or equal to 1 and a value different from the M).

10. The digitally controlled oscillator device according to claim 5, wherein the negative resistance generating circuit is disposed substantially in a center portion within the ring of the coil metal wiring.

11. A high frequency signal processing device comprising:
a first digitally controlled oscillator circuit; and
a frequency converting circuit which upconverts baseband signals using the first digitally controlled oscillator circuit;

wherein the first digital controlled oscillator circuit includes first and second oscillation output nodes from which complementary oscillation output signals are output;

coil elements coupled between the first oscillation output node and the second oscillation output node, capacitor units having the same circuit configuration and substantially the same layout configuration respectively, said each capacitor unit having a first capacitive element, a first switch and a second capacitive element coupled in series in order between first and second nodes, and a negative resistance generating circuit which generates a negative resistance between the first oscillation output node and the second oscillation output node;

wherein a part of the capacitor units configures a first capacitor bank as first capacitor units, and another part of the capacitor units configures a second capacitor bank;

wherein the first nodes of each of the first capacitor units is coupled to the first oscillation output node, and the second node thereof is coupled to the second oscillation output node, respectively;

wherein the second capacitor bank includes capacitor blocks comprising N (where N: integer greater than or equal to 2) capacitor units, said each capacitor block including a second capacitor unit being one of the N capacitor units, and (N−1) third, capacitor units being other than the second capacitor unit;

wherein the first node of the second capacitor unit is coupled to the first oscillation output node, and, the second node thereof is coupled to the second oscillation output node, respectively;

wherein the first and second nodes of the (N−1) third capacitor units are coupled to an AC ground power supply voltage;

wherein a node over the first node side, of the first switch in the second capacitor unit is coupled in common to a node over the first node side, of the first switch in each of the (N−1) third capacitor units;

wherein a node over the second node side, of the first switch in the second capacitor unit is coupled in common to a node over the second node side, of the first switch in each of the (N−1) third capacitor units, and wherein the first switches in the second capacitor unit and the (N−1) third capacitor units are controlled in common in on/off operations.

12. The high frequency signal processing device according to claim 11, wherein each of the capacitor units further includes a second switch coupled between the node over the first switch side, of the first capacitive element and the AC ground power supply voltage and controlled in on/off operation in common with the first switch, and a third switch coupled between the node over the first switch side, of the second capacitive element and the AC ground power supply voltage and controlled in on/off operation in common with the first switch.

13. The digitally controlled oscillator device according to claim 12, wherein the second capacitor bank further includes the capacitor blocks, wherein a first capacitor block corresponding to any one of the capacitor blocks has a configuration in which the value of the "N" is $2^M$ (where M: integer greater than or equal to 1), and wherein a second capacitor block corresponding to any another one of the capacitor blocks has a configuration in which the value of the "N" is $2^J$ (where J is an integer greater than or equal to 1 and a value different from the M).

* * * * *